US011798864B2

(12) United States Patent
Choi

(10) Patent No.: US 11,798,864 B2
(45) Date of Patent: Oct. 24, 2023

(54) SEMICONDUCTOR PACKAGE WITH METAL POST HAVING NON-VERTICAL STRUCTURE

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 394 days.

(21) Appl. No.: 17/147,460

(22) Filed: Jan. 13, 2021

(65) Prior Publication Data

US 2021/0358832 A1    Nov. 18, 2021

(30) Foreign Application Priority Data

May 13, 2020 (KR) .......................... 10-2020-0057104

(51) Int. Cl.

| H01L 23/433 | (2006.01) |
|---|---|
| H01L 23/367 | (2006.01) |
| H01L 23/498 | (2006.01) |
| H01L 25/065 | (2023.01) |

(52) U.S. Cl.
CPC .......... H01L 23/433 (2013.01); H01L 23/367 (2013.01); H01L 23/49833 (2013.01); *H01L 25/0652* (2013.01)

(58) Field of Classification Search
CPC . H01L 23/4334; H01L 24/40; H01L 23/3735; H01L 23/49811; H01L 24/37;

(Continued)

(56) References Cited

U.S. PATENT DOCUMENTS

2020/0105648 A1* 4/2020 Prajuckamol ..... H01L 23/49513
2022/0399300 A1* 12/2022 Choi ....................... H01L 24/37

FOREIGN PATENT DOCUMENTS

| CN | 102222663 A | * | 10/2011 | ....... H01L 23/49816 |
| CN | 106298724 A | * | 1/2017 | ....... H01L 34/49531 |

(Continued)

OTHER PUBLICATIONS

Lim Chang Hyun et al., English Translation of KR20130045596A (Year: 2013).*

*Primary Examiner* — Ismail A Muse
(74) *Attorney, Agent, or Firm* — PARK, KIM & SUH, LLC

(57) ABSTRACT

Provided is a semiconductor package including: a first substrate comprising a specific pattern formed thereon to enable electrical connection; a second substrate, which is spaced apart from and faces the first substrate, comprising a specific pattern formed thereon to enable electrical connection; at least one semiconductor chip attached to the first substrate; at least one metal post formed in a non-vertical structure between the first substrate and the second substrate for dispersing a coefficient of thermal expansion (CTE) stress directly generated from the second substrate, wherein the metal post comprises one end attached on the at least one semiconductor chip, and the other end attached on the pattern of the first substrate or the second substrate; at least one terminal lead electrically connected to the first substrate or the second substrate; and a package housing covering the first and second substrates and exposing the terminal leads to the outside.

12 Claims, 25 Drawing Sheets

(58) Field of Classification Search
CPC ..... H01L 24/433; H01L 23/367; H01L 24/32; H01L 23/49531; H01L 23/5385; H01L 24/00; H01L 23/5386; H01L 23/49833; H01L 25/072; H01L 24/33; H01L 2224/73265; H01L 2224/33181; H01L 2924/181; H01L 2924/00014; H01L 2224/40225; H01L 24/73; H01L 25/0652; H01L 2224/48091; H01L 2224/37013; H01L 24/48; H01L 2224/32225; H01L 2224/48227; H01L 2924/00012; H01L 2224/45099; H01L 2224/73221; H01L 23/498; H01L 25/065
USPC .......................................................... 257/678
See application file for complete search history.

(56) References Cited

FOREIGN PATENT DOCUMENTS

| | | | | | |
|---|---|---|---|---|---|
| CN | 107170714 | A | * | 9/2017 | ......... H01L 23/4334 |
| CN | 206864452 | U | * | 1/2018 | ... H01L 2224/32225 |
| CN | 207038508 | U | * | 2/2018 | ... H01L 2224/32225 |
| CN | 110444525 | A | * | 11/2019 | ......... H01L 23/3107 |
| KR | 10-2001-0111736 | A | | 12/2001 | |
| KR | 10-0867573 | B1 | | 11/2008 | |
| KR | 10-2013-0045596 | A | | 5/2013 | |
| KR | 20130045596 | A | * | 5/2013 | ............. H01L 23/34 |
| KR | 10-2016-0085672 | A | | 7/2016 | |
| KR | 10-1643332 | B1 | | 7/2016 | |
| KR | 10-2018-0075249 | A | | 7/2018 | |
| KR | 10-2019-0095882 | A | | 8/2019 | |
| KR | 20130045596 | A | * | 5/2023 | ............. H01L 23/34 |

* cited by examiner

SEMICONDUCTOR PACKAGE WITH METAL POST HAVING NON-VERTICAL STRUCTURE

CROSS-REFERENCE TO RELATED PATENT APPLICATION

This application claims the benefit of Korean Patent Application No. 10-2020-0057104, filed on May 13, 2020, in the Korean Intellectual Property Office, the disclosure of which is incorporated herein in its entirety by reference.

BACKGROUND OF THE INVENTION

1. Field of the Invention

The present invention relates to a metal post, a semiconductor package including the same, and a method of manufacturing the semiconductor package, in which coefficient of thermal expansion (CTE) stress is absorbed, relieved, detoured and thereby, dispersed through the metal post having a non-vertical structure and thereby, cracks may be prevented from being generated on an adhesive which is a part bonded to a semiconductor chip.

2. Description of the Related Art

In general, a semiconductor package includes a semiconductor chip formed on a substrate, a conductor which is a metal post used as a spacer attached on the semiconductor chip, a lead frame formed of Cu, and a housing molded using a sealing member. The semiconductor chip is attached on a lead frame pad, and a lead frame lead is electrically connected to a pad of the semiconductor chip by using a bonding wire, which is a signal line, wherein the bonding wire is attached on a plating layer including Ag interposed between the lead frame lead and the pad of the semiconductor chip.

For example, as illustrated in FIG. 1A, a semiconductor chip 14 is attached on a lower metal insulated substrate 11A by using a primary bonding part 12 interposed therebetween, a conductor 17 is attached on the semiconductor chip 14 by using a secondary bonding part 16 interposed therebetween, the semiconductor chip 14 is attached on an upper metal insulated substrate 11B by using a primary bonding part 12 interposed therebetween, and the conductor 17 is attached on the semiconductor chip 14 by using the secondary bonding part 16 interposed therebetween. Accordingly, the semiconductor package is formed in a both-sided substrate package structure where the semiconductor chips are alternately attached to substrates at both sides.

The semiconductor chip is respectively attached to the substrate and the conductor by using a solder. However, as illustrated in FIG. 1B, cracks may be generated from the primary bonding part 12 or the secondary bonding part 16 due to each different coefficient of thermal expansion (CTE) of the lower and upper metal insulated substrates 11A and 11B, the conductor 17, the primary bonding part 12, and the secondary bonding part 16. Accordingly, problems on reliability of the semiconductor package may occur.

In order to minimize a CTE difference with the semiconductor chip, a material having a CTE similar with that of the semiconductor chip is selected and used instead of a metal post. However, such a material is significantly expensive compared with a general metal post and thereby, price competitiveness of a product is lowered.

SUMMARY OF THE INVENTION

The present invention provides a metal post, a semiconductor package including the same, and a method of manufacturing the semiconductor package, in which coefficient of thermal expansion (CTE) stress is absorbed, relieved, detoured and thereby, dispersed through the metal post having a non-vertical structure and thereby, cracks may be prevented from being generated on an adhesive which is a part bonded to a semiconductor chip.

According to an aspect of the present invention, there is provided a semiconductor package including: a first substrate comprising a specific pattern formed thereon to enable electrical connection; a second substrate, which is spaced apart from and faces the first substrate, comprising a specific pattern formed thereon to enable electrical connection; at least one semiconductor chip attached to the first substrate; at least one metal post formed in a non-vertical structure between the first substrate and the second substrate for dispersing a coefficient of thermal expansion (CTE) stress directly generated from the second substrate, wherein the metal post comprises one end attached on the at least one semiconductor chip, and the other end attached on the pattern of the first substrate or the second substrate; at least one terminal lead electrically connected to the first substrate or the second substrate; and a package housing covering the first and second substrates and exposing the terminal leads to the outside.

According to another aspect of the present invention, there is provided a semiconductor package including: a first substrate comprising a specific pattern formed thereon to enable electrical connection; a second substrate, which is spaced apart from and faces the first substrate, comprising a specific pattern formed thereon to enable electrical connection; at least one semiconductor chip each attached to the first substrate and the second substrate; at least one metal post formed in a non-vertical structure between the first substrate and the second substrate for dispersing a coefficient of thermal expansion (CTE) stress directly generated from the first substrate and the second substrate, wherein the metal post comprises one end attached on the semiconductor chip of the first substrate or the second substrate, and the other end attached on the pattern of the first substrate or the second substrate; at least one terminal lead electrically connected to the first substrate or the second substrate; and a package housing covering the first and second substrates and exposing the terminal leads to the outside.

The first substrate or the second substrate may include at least one insulation layer.

The first substrate or the second substrate may be formed of a single metal layer, an alloy metal layer, or a plated metal layer.

The first substrate or the second substrate may be formed by stacking the insulation layer and metal layers formed on the upper surface, the lower surface, or the upper and lower surfaces of the insulation layer.

The semiconductor chip may include any one of IGBT, MOSFET, and a diode, which is a power semiconductor.

The metal post may be formed of a single material including Cu, Al, or Sn, an alloy material containing any one of Cu, Al, Sn, SiC, Mo, and Mn, or a compound material including a powder mixture.

The metal post may include at least one layer formed by metal plating or metal coating.

One end of the metal post may be attached on the semiconductor chip of the first substrate and the other end of the metal post may be attached on the pattern of the second substrate.

The metal post may include a horizontal clip attached on and electrically connected to the semiconductor chip of the first substrate or the second substrate, and a vertical clip extended from one end of the horizontal clip in a vertical direction and attached on and electrically connected to the patterns of the first substrate and the second substrate.

The metal post may include a first horizontal clip attached on and electrically connected to the semiconductor chip of the first substrate or the second substrate, and the second horizontal clip extended from one end of the first horizontal clip in a horizontal direction and attached on and electrically connected to the pattern of the first substrate or the second substrate, on which the first horizontal clip is also attached.

The semiconductor package may further include a metal bridge formed in a vertical structure between the first substrate and the second substrate to support and electrically connect the first substrate and the second substrate.

The terminal leads may be electrically connected to any one of the first substrate and the second substrate.

The terminal lead may be attached to the first substrate or the second substrate by soldering, sintering, or ultrasonic welding.

The metal post may be attached to the pattern of the first substrate or the second substrate by ultrasonic welding.

The first substrate or the second substrate may be formed to be entirely or partly exposed to the upper surface or the outer lower surface of the package housing.

The surfaces of the first substrate or the second substrate exposed to the outside of the package housing may include a lattice arranged to widen radiating surfaces, a radiation fin, or a radiation structure in a water-cooling type or an air-cooling type.

The package housing may be formed of EMC, PBT, or PPS.

Electrical signal lines for applying an electrical signal to the semiconductor chips may be bonded to the first substrate, the second substrate, the terminal lead, or the semiconductor chip and may be electrically connected to each other.

The electrical signal lines may be conductive wires, metal clips, metal ribbons, or metal bridges.

The metal post may have an elastic non-vertical structure in an E-letter, S-letter or a Z-letter zigzag form or a non-vertical structure in a ¬-letter, a L-letter, or ⎯-letter form, between the first substrate and the second substrate.

According to another aspect of the present invention, there is provided a method of manufacturing the semiconductor package described above.

According to another aspect of the present invention, there is provided a metal post applied to the semiconductor package described above.

According to another aspect of the present invention, there is provided a semiconductor package used in an inverter, a converter, or driving of a motor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
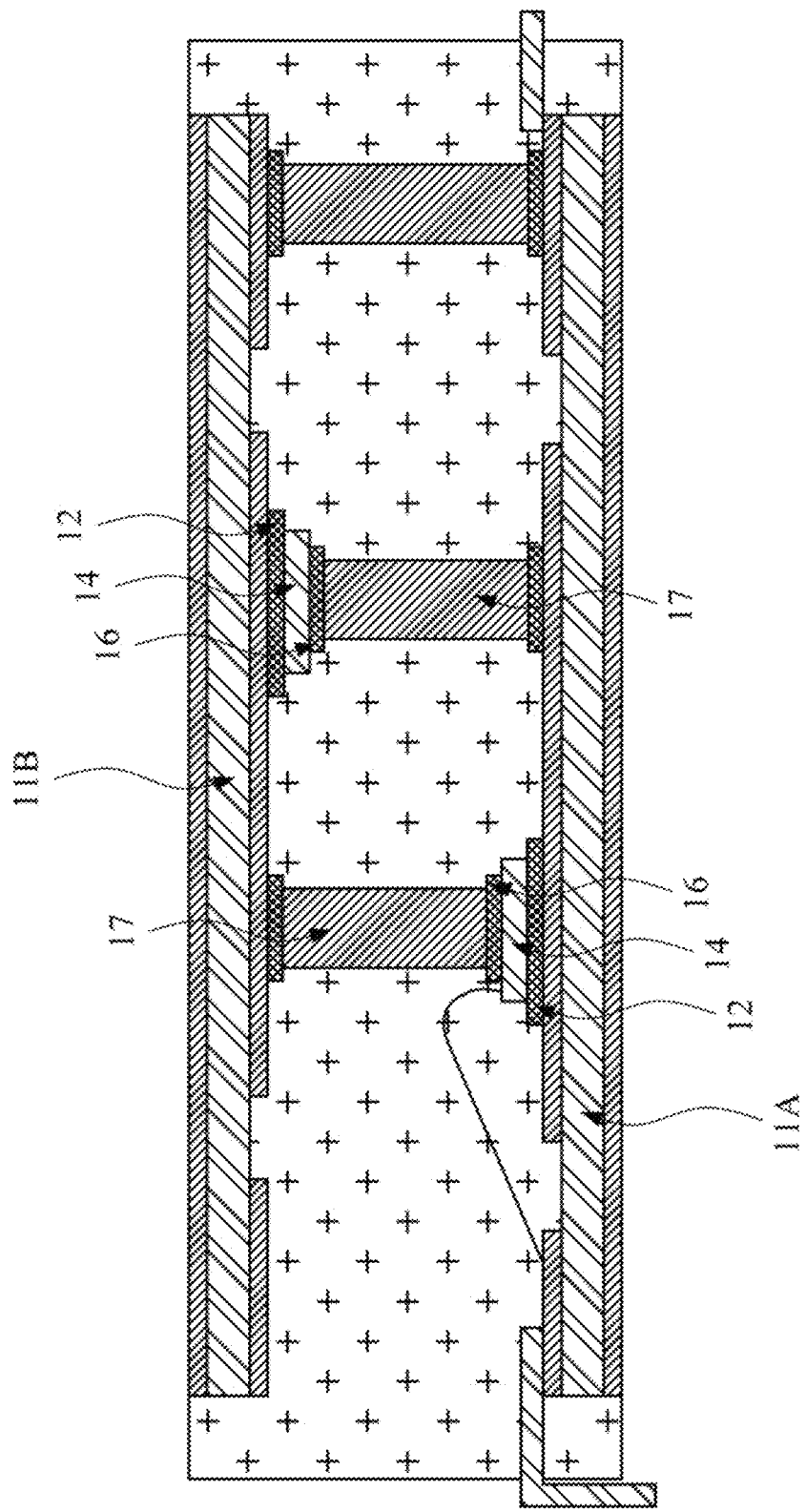
FIGS. 1A and 1B illustrate a general semiconductor package.
Figure 1B:
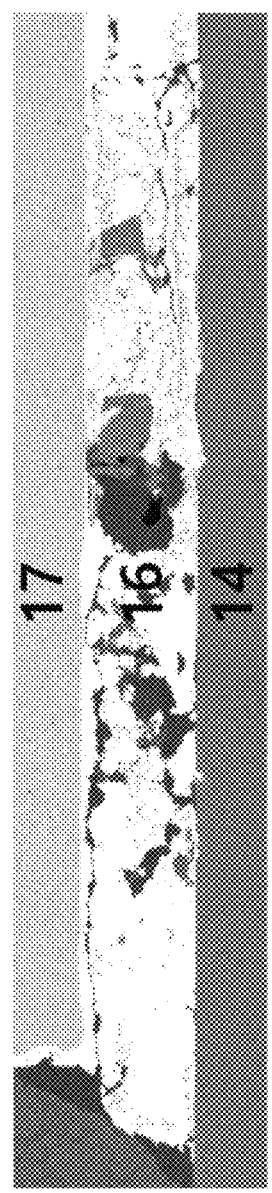
Figure 1B:
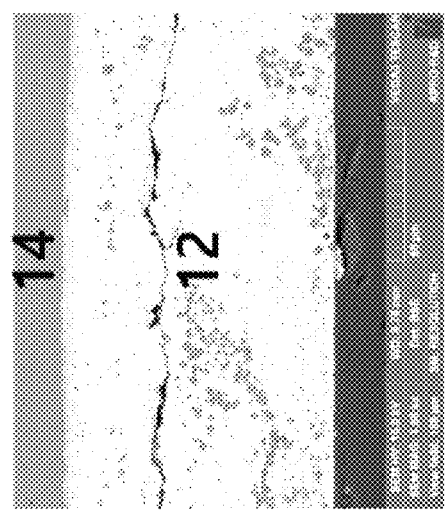

Hereinafter, the present invention will be described in more detail with reference to the accompanying drawings.

Referring to FIGS. 2 through 7B, a semiconductor package according to an embodiment of the present invention has a both-sided substrate structure, where a semiconductor chip is only attached to a substrate at one side, and includes a first substrate 110 including a specific pattern 111 formed thereon to enable electrical connection, a second substrate 120, which is spaced apart from and faces the first substrate 110, including a specific pattern 121 formed thereon to enable electrical connection, at least one semiconductor chip 130 attached to the first substrate 110, at least one metal post 140 formed in a non-vertical structure between the first substrate 110 and the second substrate 120 for dispersing a coefficient of thermal expansion (CTE) stress directly generated from the second substrate 120, wherein the metal post 140 includes one end attached on the at least one semiconductor chip 130, and the other end attached on the pattern 111 and/or the pattern 121 of the first substrate 110 and/or the second substrate 120, at least one terminal lead 150 electrically connected to the first substrate 110 or the second substrate 120, and a package housing 160 covering the first and second substrates 110 and 120 and exposing the terminal leads 150 to the outside. Accordingly, cracks of adhesives 112 and 141 occurring due to an external stress may be prevented and thereby, reliability of bonded parts may be improved.

Figure 2:
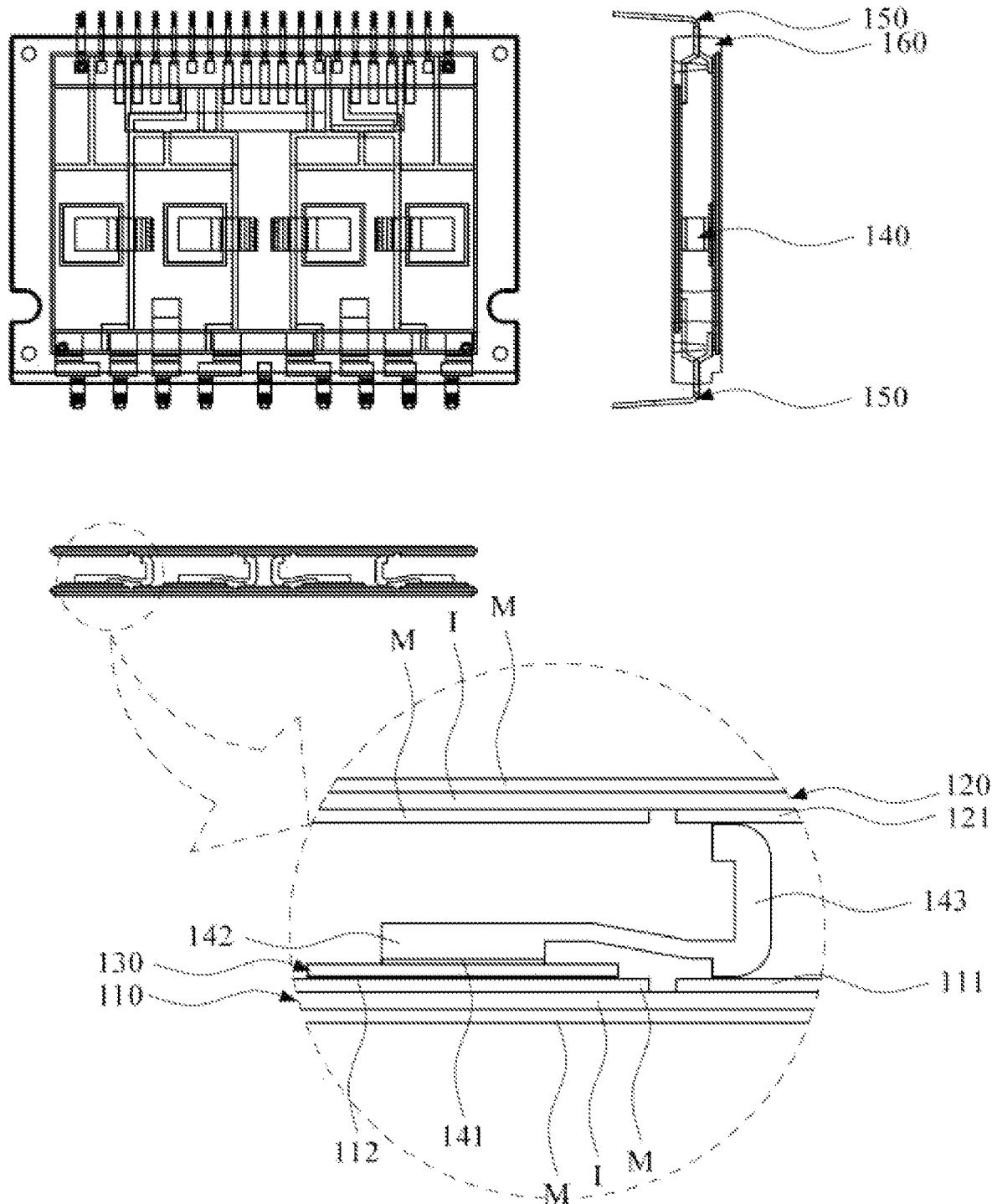
FIGS. 2, 3A and 3B illustrate a first example of a semiconductor package according to an embodiment of the present invention.
Figure 3A:
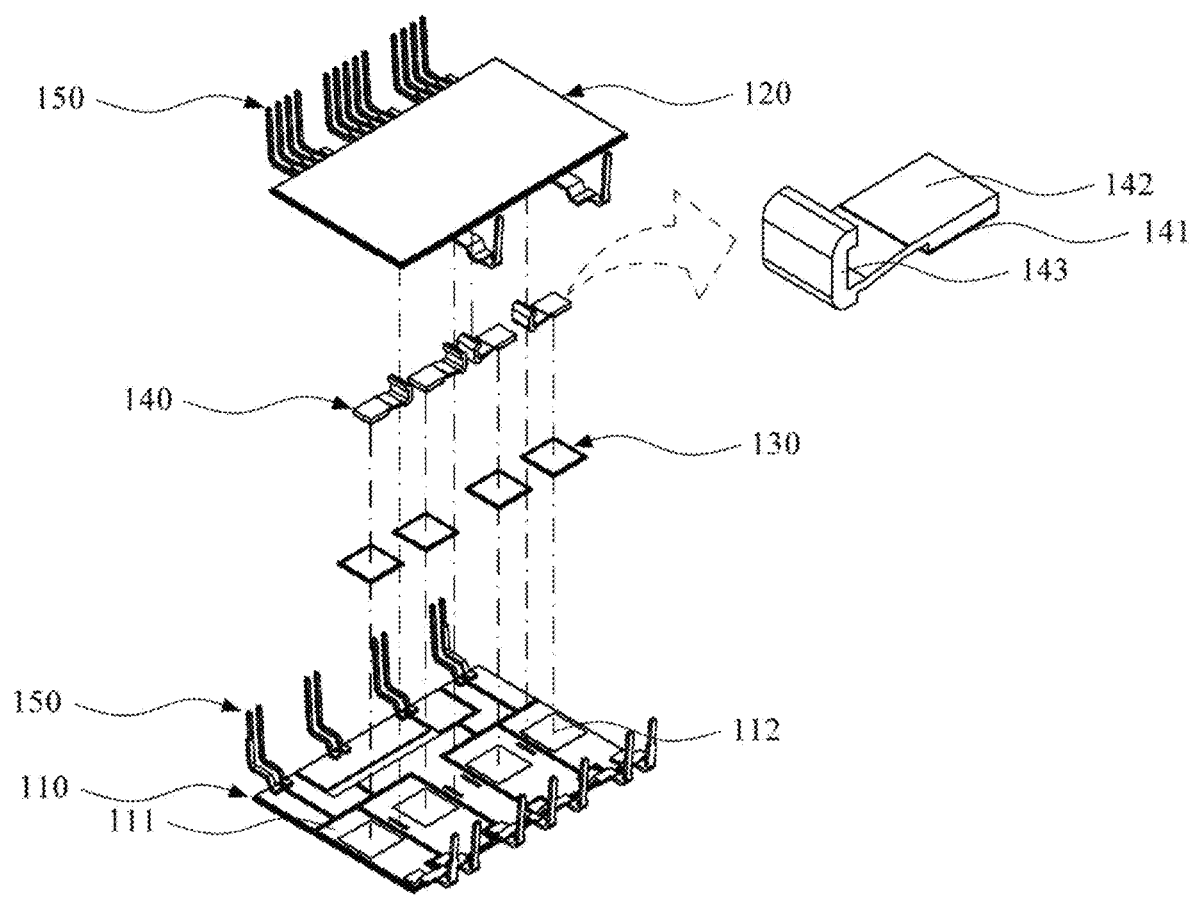
Figure 3B:
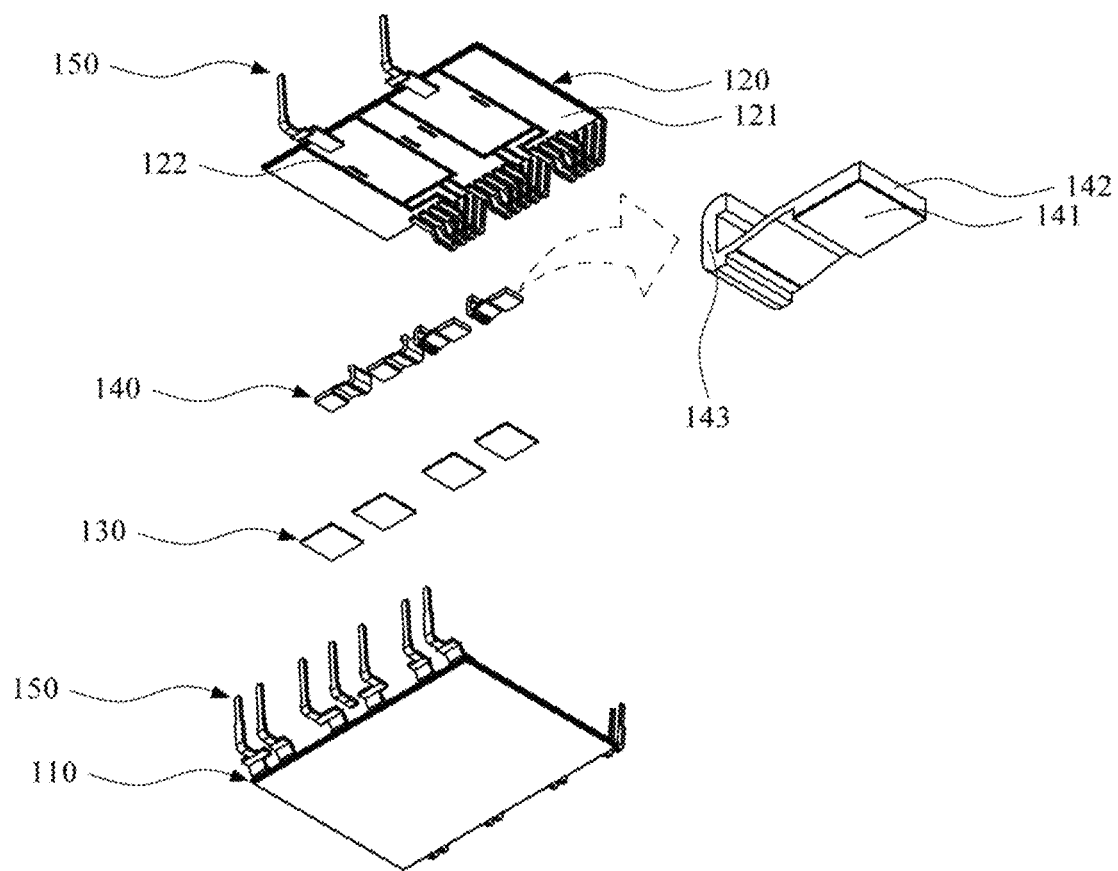

FIGS. 2, 3A and 3B illustrate a first example of a semiconductor package according to an embodiment of the present invention. As illustrated in FIGS. 2, 3A and 3B, the semiconductor chips 130 are electrically connected to the first substrate 110 and the terminal leads 150, which are lead frames, are each connected to the first substrate 110 and the second substrate 120. Also, one end of the metal post 140, which has a non-vertical structure, is attached on the semiconductor chip 130 of the first substrate 110, and the other end thereof is attached to the pattern 121 of the second substrate 120 by using an adhesive 122.

More specifically, as illustrated in an enlarged view of FIGS. 2, 3A and 3B, the metal post 140 includes a horizontal clip 142 and a vertical clip 143, wherein the horizontal clip 142 is attached on and electrically connected to the semiconductor chip 130, which is selectively attached to the first substrate 110 or the second substrate 120, and the vertical clip 143 is extended from one end of the horizontal clip 142 in a vertical direction and is each attached on and electrically connected to the patterns 111 and 121 of the first substrate 110 and the second substrate 120. Accordingly, the metal post 140 has a non-vertical structure in a L-letter clip form so that a CTE stress, which may be delivered from the second substrate 120, the adhesive 122, or the metal post 140 to the semiconductor chip 130, may be detoured and dispersed to the pattern 111 of the first substrate 110 through the vertical clip 143. Therefore, cracks generated in parts bonded to the semiconductor chip 130, which are the adhesives 112 and 141, may be prevented.

Figure 4:
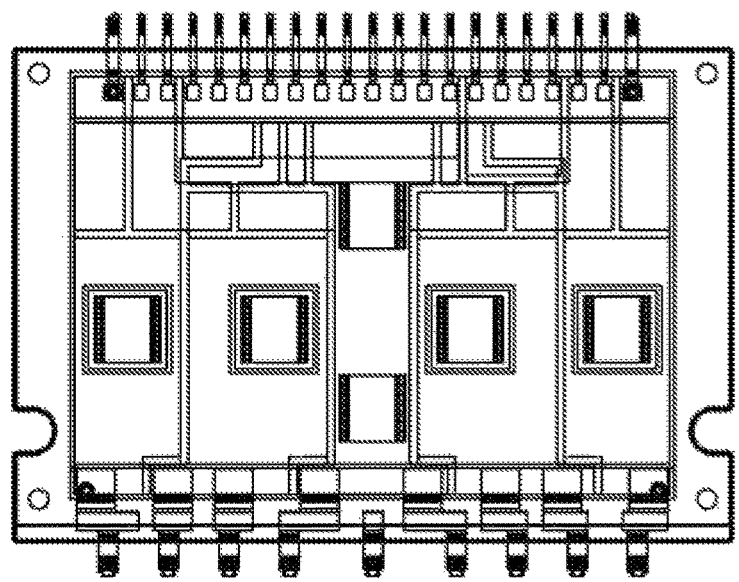
FIGS. 4, 5A and 5B illustrate a second example of a semiconductor package according to an embodiment of the present invention.
Figure 4:
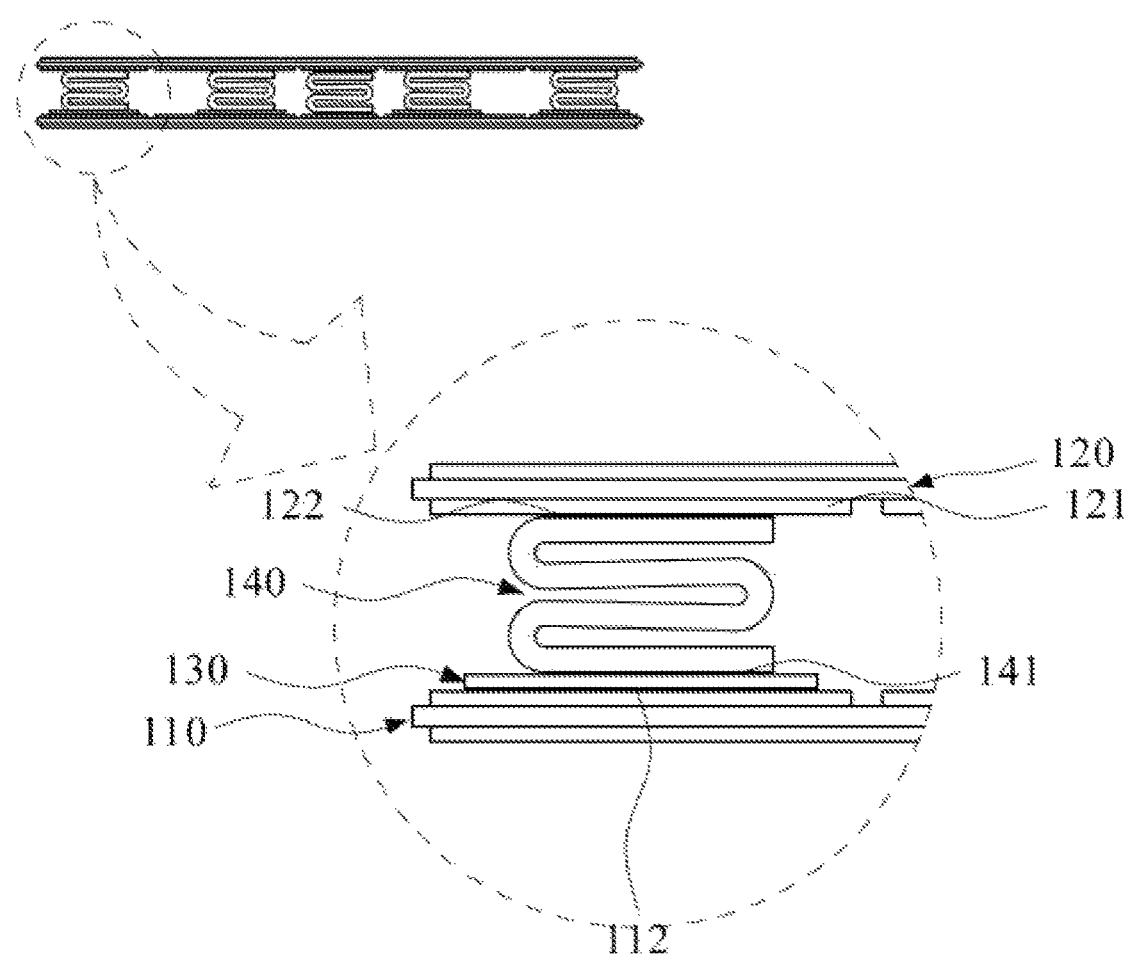
Figure 5A:
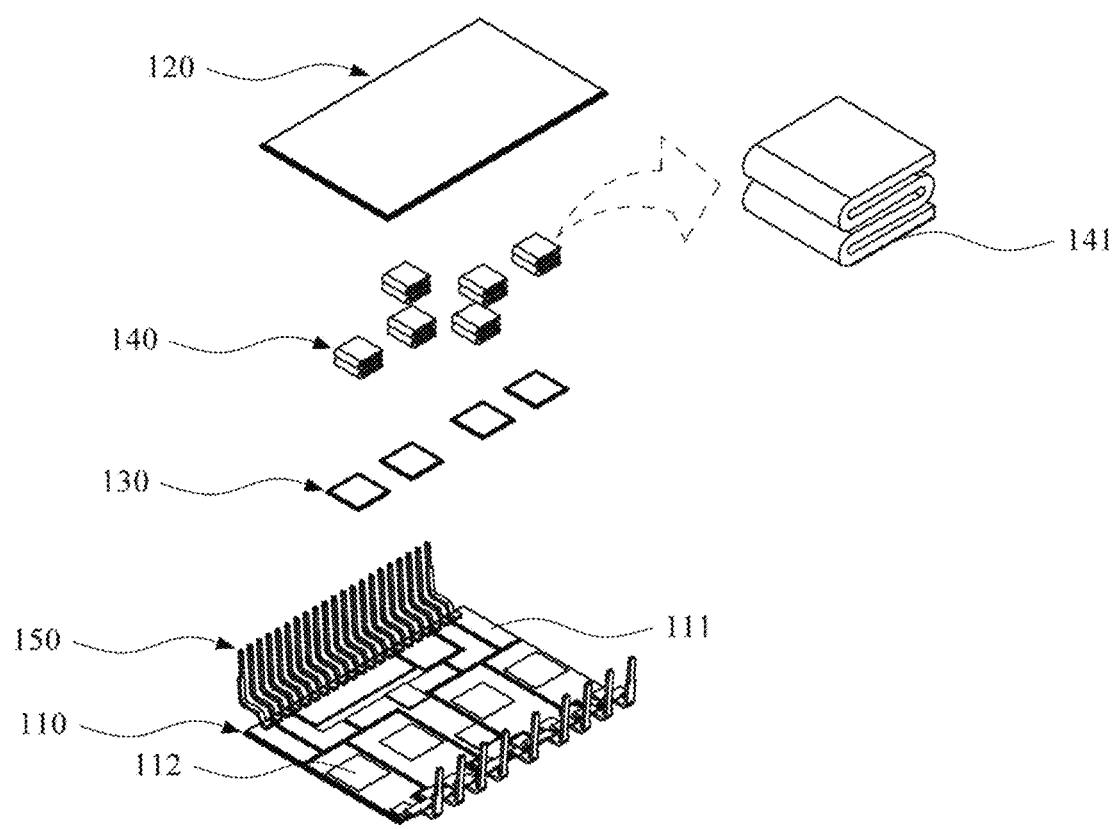
Figure 5B:
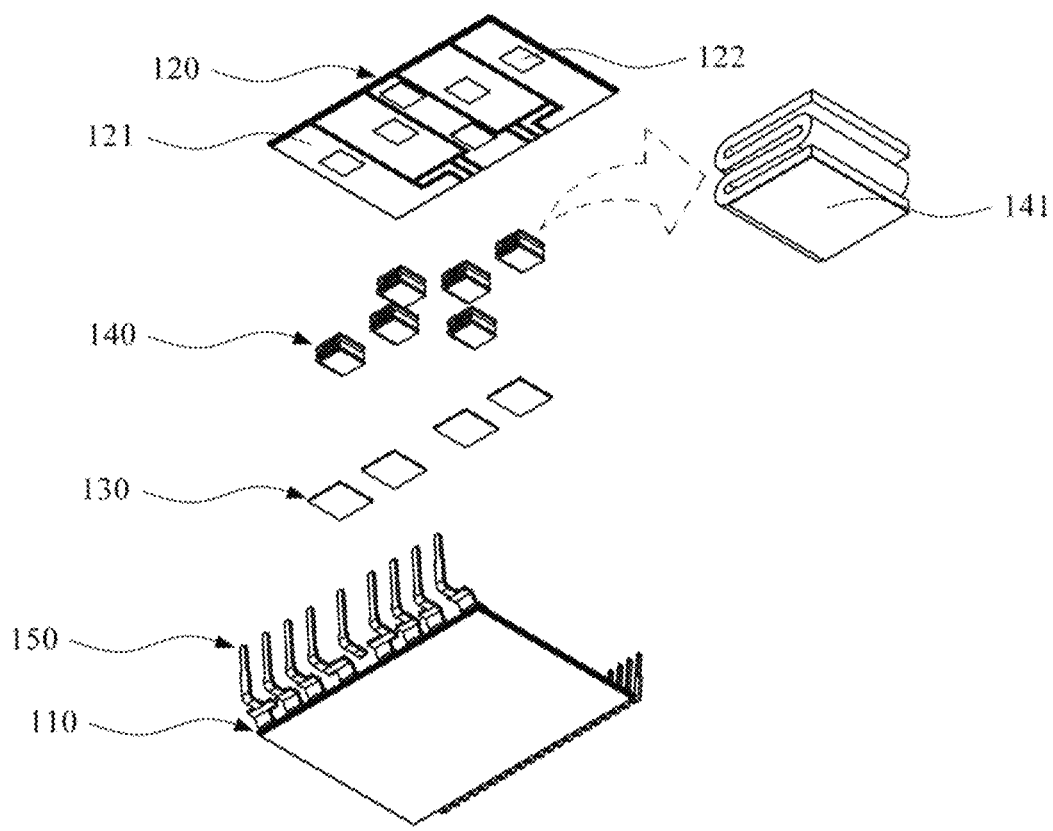

FIGS. 4, 5A and 5B illustrate a second example of a semiconductor package according to an embodiment of the present invention. As illustrated in FIGS. 4, 5A and 5B, the semiconductor chips 130 are electrically connected to the first substrate 110, the terminal leads 150, which are lead frames, are connected to the first substrate 110, and the first and second substrates 110 and 120 are supported by using the metal posts 140 as the replacement of general metal spacers. Also, one end of the metal post 140, which has a non-vertical structure, is attached on the semiconductor chip 130 of the first substrate 110 and the other end thereof is attached to the pattern 121 of the second substrate 120 by using the adhesive 122.

More specifically, as illustrated in an enlarged view of FIGS. 4, 5A and 5B, the metal post 140 has a non-vertical structure in an E-letter zigzag form between the first substrate 110 and the second substrate 120 so that a CTE stress, which may be delivered from the adhesive 122 or the metal post 140 to the semiconductor chip 130, may be absorbed and relieved by using the elastic non-vertical structure in a zigzag form which performs as a spring. Accordingly, cracks generated in parts bonded to the semiconductor chip 130, which are the adhesives 112 and 141, may be prevented.

Figure 6:
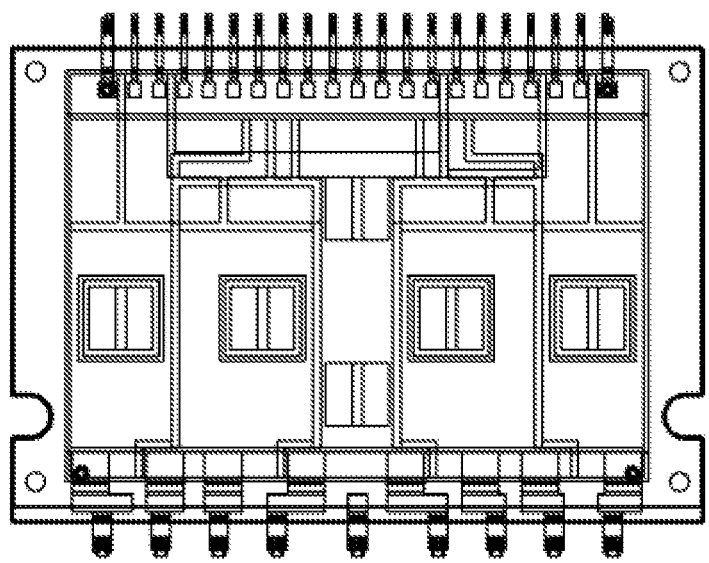
FIGS. 6, 7A and 7B illustrate a third example of a semiconductor package according to an embodiment of the present invention.
Figure 6:
Figure 6:
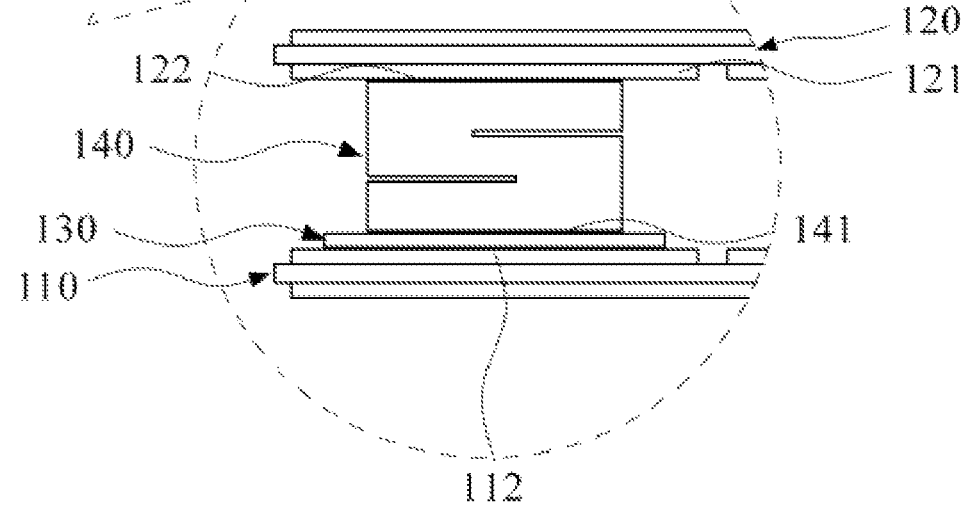
Figure 7A:
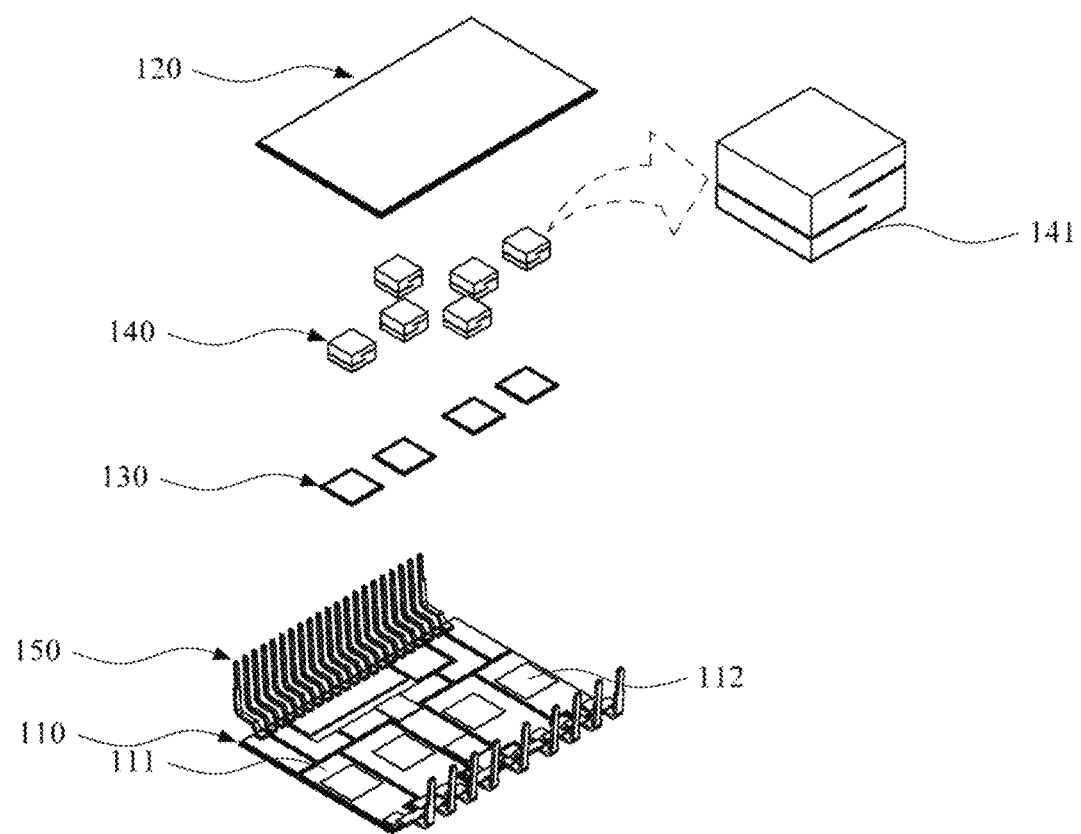
Figure 7B:
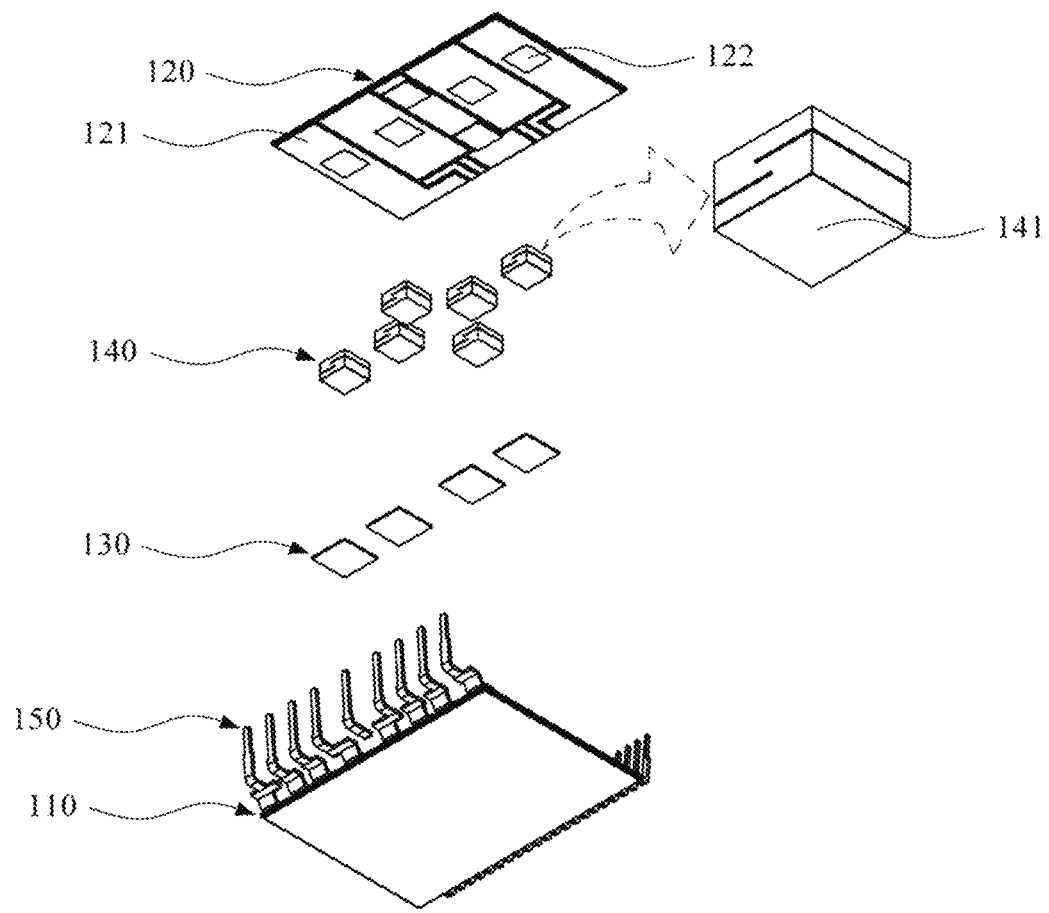

FIGS. 6, 7A and 7B illustrate a third example of a semiconductor package according to an embodiment of the present invention. As illustrated in FIGS. 6, 7A and 7B, the semiconductor chips 130 are electrically connected to the first substrate 110, the terminal leads 150, which are lead frames, are connected to the first substrate 110, and the first and second substrates 110 and 120 are supported by using the metal posts 140 as the replacement of general metal spacers. Also, one end of the metal post 140, which has a non-vertical structure, is attached on the semiconductor chip 130 of the first substrate 110 and the other end thereof is attached on the pattern 121 of the second substrate 120 by using the adhesive 122.

More specifically, as illustrated in an enlarged view of FIGS. 6, 7A and 7B, the metal post 140 has a non-vertical structure in a S-letter or a Z-letter zigzag form between the first substrate 110 and the second substrate 120 so that a CTE stress, which may be directly delivered from the adhesive 122 or the metal post 140 to the semiconductor chip 130, may be absorbed and relieved by using the elastic non-vertical structure in a zigzag form which performs as a spring. Accordingly, cracks generated in parts bonded to the semiconductor chip 130, which are the adhesive 112 and the adhesive 141, may be prevented.

Referring to FIGS. 8 through 15B, a semiconductor package according to another embodiment of the present invention has a both-sided substrate structure, where the semiconductor chips are respectively attached to the substrates at both sides, and includes the first substrate 110 including the specific pattern 111 formed thereon to enable electrical connection, the second substrate 120, which is spaced apart from and faces the first substrate 110, including the specific pattern 121 formed thereon to enable electrical connection, at least one semiconductor chip 130A and 130B each attached to the first substrate 110 and the second substrate 120, at least one metal post 140 formed in a non-vertical structure between the first substrate 110 and the second substrate 120 for dispersing a CTE stress directly generated from the first substrate 110 and the second substrate 120, wherein the metal post 140 includes one end attached on the semiconductor chip 130A or 130B of the first substrate 110 or the second substrate 120, and the other end attached on the pattern 111 or 121 of the first substrate 110 or the second substrate 120, at least one terminal lead 150 electrically connected to the first substrate 110 or the second substrate 120, and a package housing 160 covering the first and second substrates 110 and 120 and exposing the terminal leads 150 to the outside. Accordingly, cracks of adhesives 112, 123, and 141 occurring due to an external stress may be prevented and thereby, reliability of bonded parts may be improved.

Figure 8:
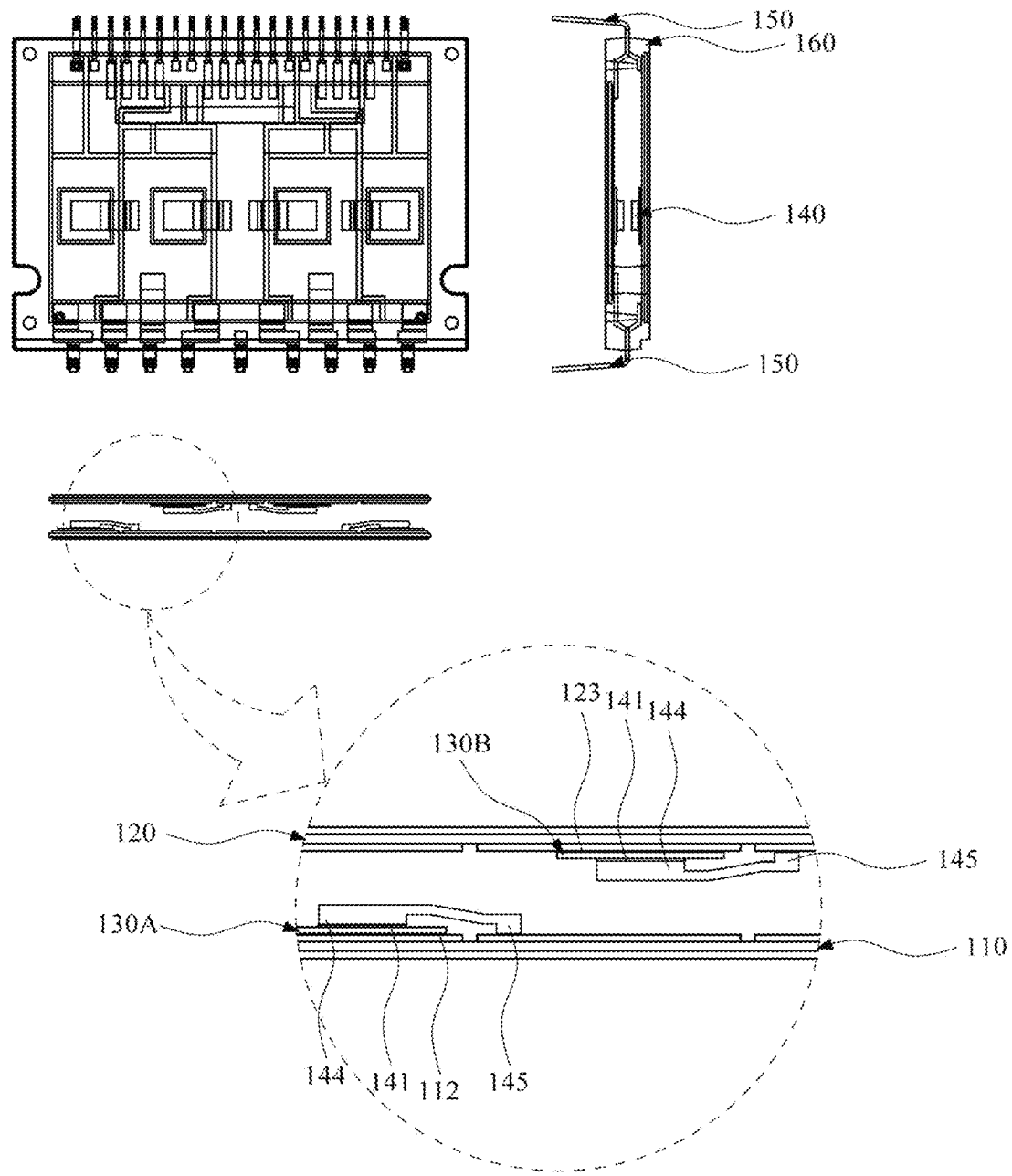
FIGS. 8, 9A and 9B illustrate a first example of a semiconductor package according to another embodiment of the present invention.
Figure 9A:
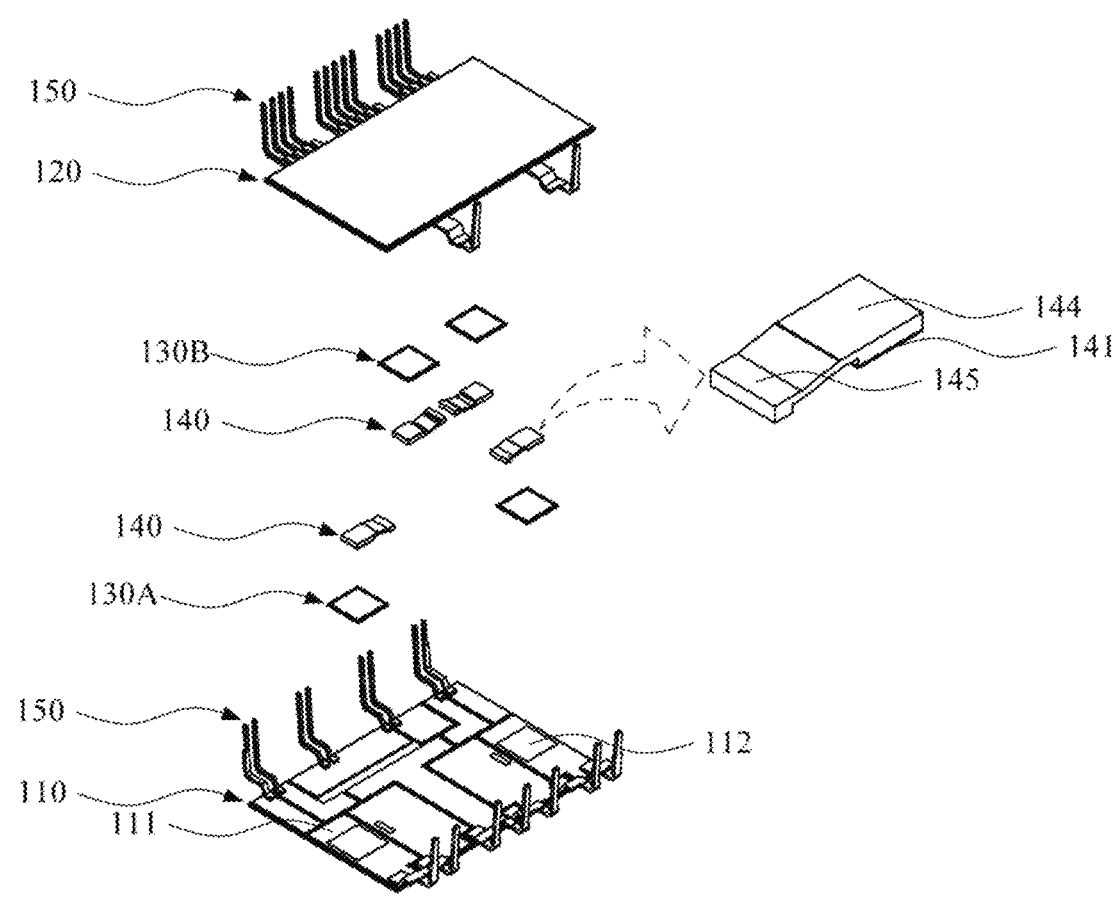
Figure 9B:
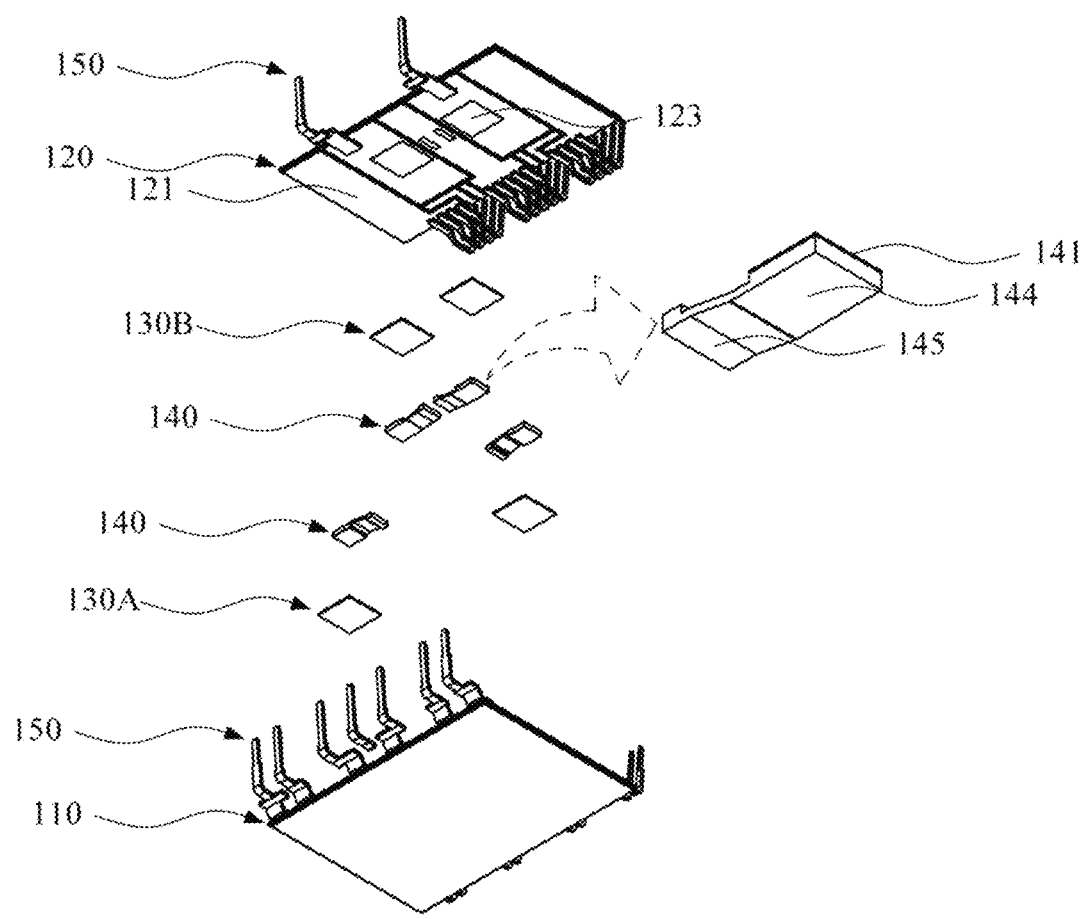

FIGS. 8, 9A and 9B illustrate a first example of a semiconductor package according to another embodiment of the present invention. As illustrated in FIGS. 8, 9A and 9B, the semiconductor chips 130A are electrically connected to the first substrate 110, the semiconductor chips 130B are electrically connected to the second substrate 120, and the terminal leads 150, which are lead frames, are each connected to the first substrate 110 and the second substrate 120 upward and downward. Also, as the replacement of a general spacer, one end of the metal post 140, which has a non-vertical structure, is attached on the semiconductor chip 130A or 130B of the first substrate 110 or the second substrate 120, and the other end thereof is attached to the pattern 111 or 121 of the first substrate 111 or the second substrate 120 by using the adhesive 112 or 123.

More specifically, as illustrated in an enlarged view of FIGS. 8, 9A and 9B, the metal post 140 in a ¬-letter clip form includes a first horizontal clip 144 and a second horizontal clip 145, wherein the first horizontal clip 144 is each attached on and electrically connected to the semiconductor chips 130A and 130B, and the second horizontal clip 145 is bent and extended from one end of the first horizontal clip 144 in a horizontal direction and is each attached on and electrically connected to the pattern 111 or 121 of the first substrate 110 or the second substrate 120, on which the first horizontal clip 144 is also attached, by using adhesives. Accordingly, a CTE stress, which may be directly delivered from the second substrate 120, the adhesive 123, or the metal post 140 to the semiconductor chip 130A, or a CTE stress, which may be directly delivered from the first substrate 110, the adhesive 112, or the metal post 140 to the semiconductor chip 130B, may be detoured and dispersed. Therefore, cracks generated in parts bonded to the semiconductor chips 130A and 130B, which are the adhesive 112 and the adhesive 123, may be prevented.

Figure 10:
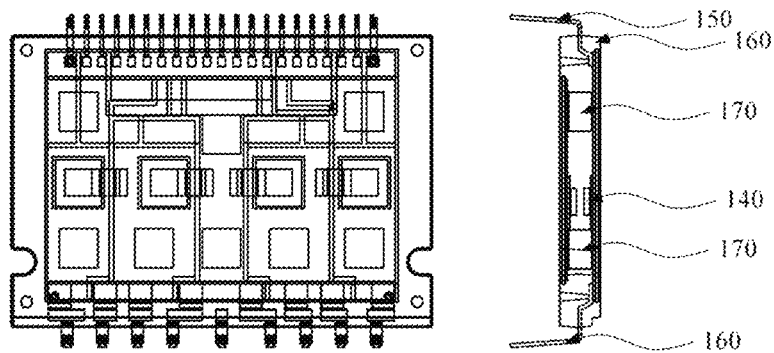
FIGS. 10, 11A and 11B illustrate a second example of a semiconductor package according to another embodiment of the present invention.
Figure 10:
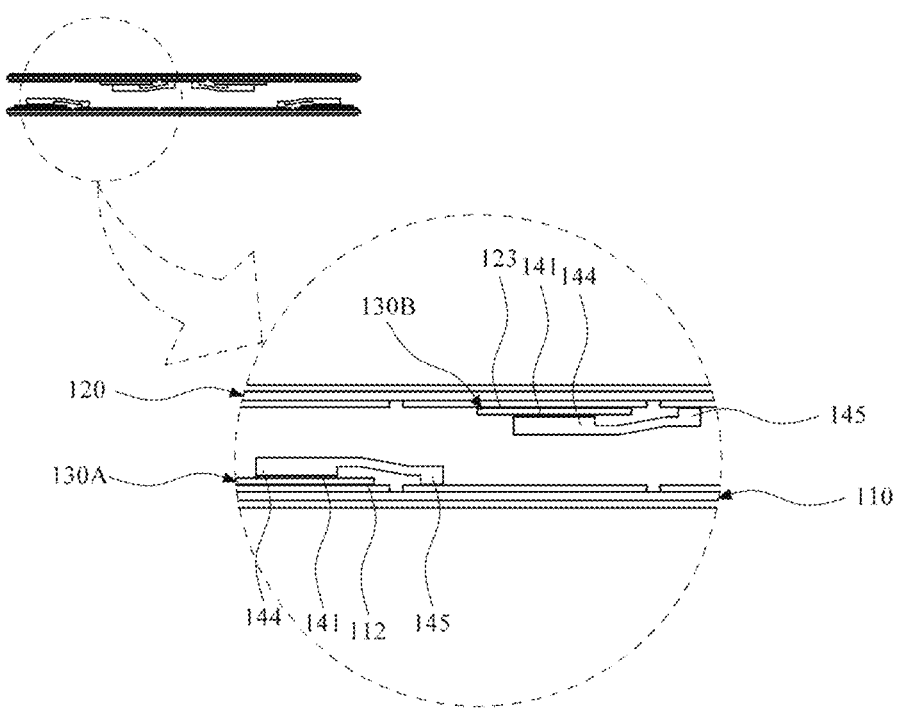
Figure 10:
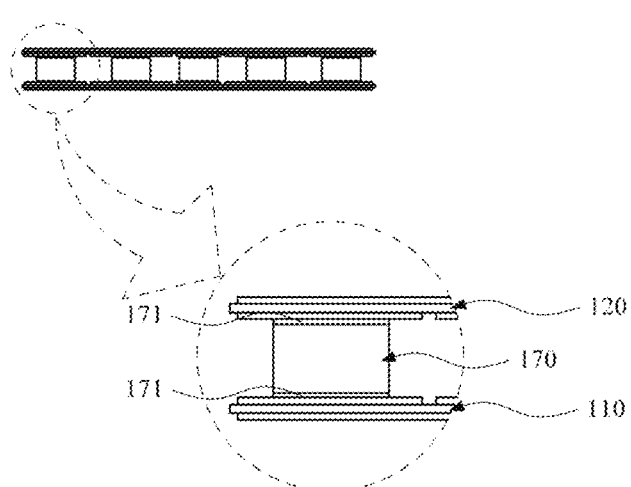
Figure 11A:
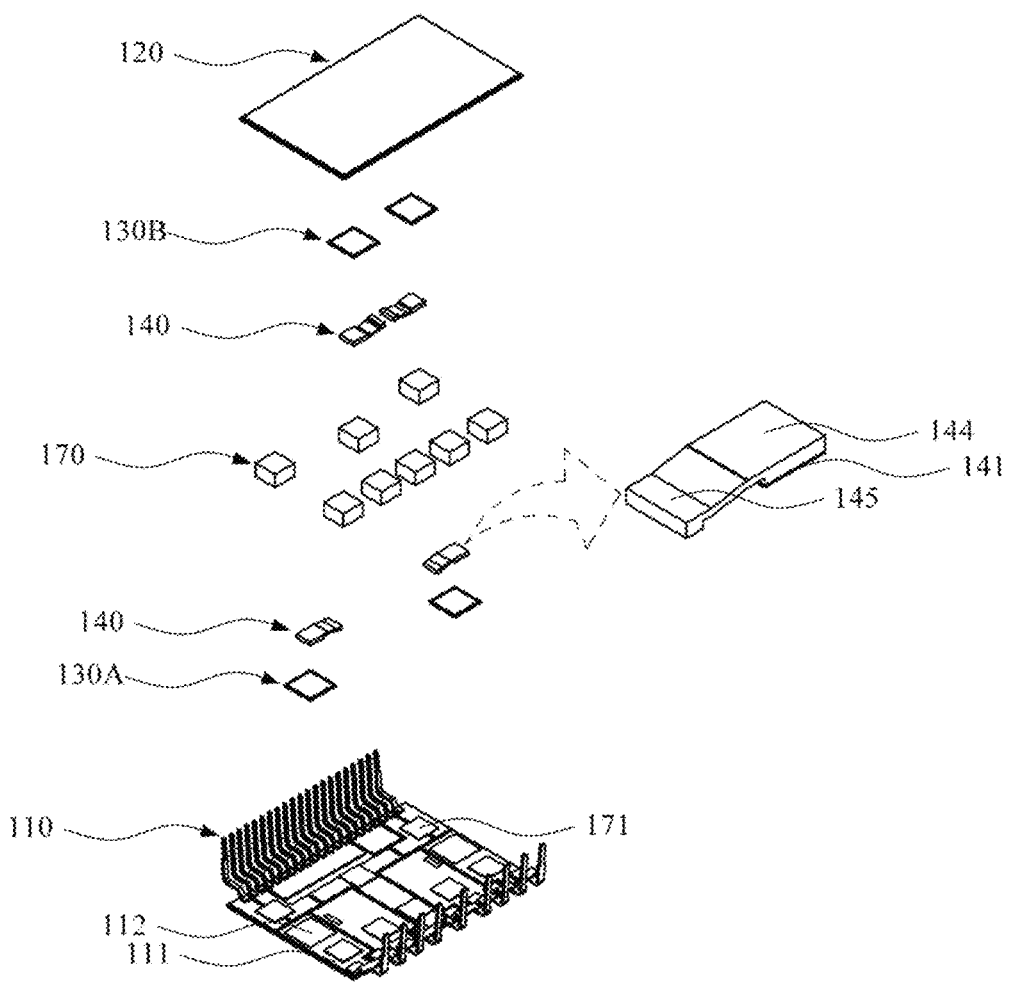
Figure 11B:
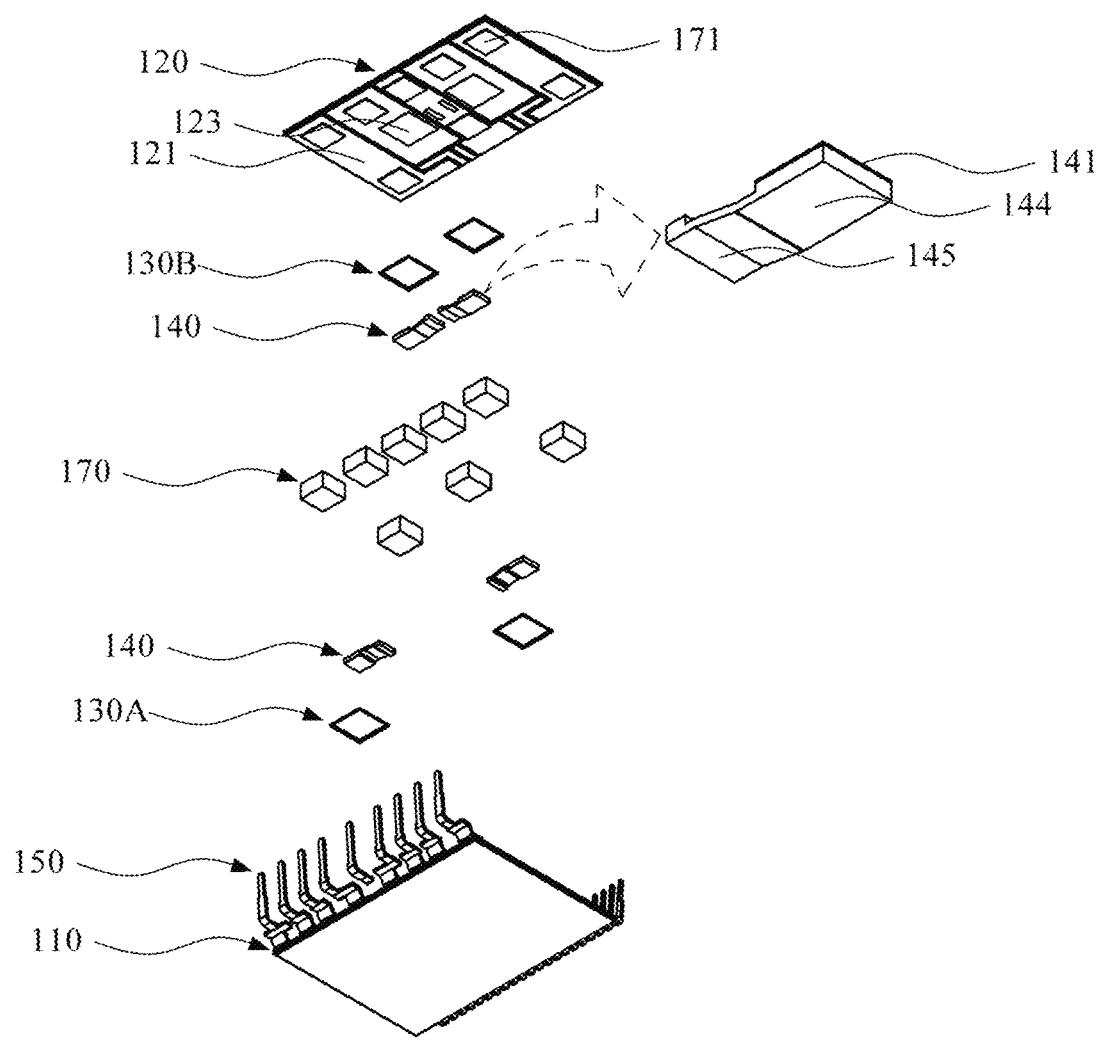

FIGS. 10, 11A and 11B illustrate a second example of a semiconductor package according to another embodiment of the present invention. As illustrated in FIGS. 10, 11A and 11B, the semiconductor chips 130A are electrically connected to the first substrate 110, the semiconductor chips 130B are electrically connected to the second substrate 120, and the terminal leads 150, which are lead frames, are connected to the first substrate 110. Also, as the replacement of a general spacer, one end of the metal post 140, which has a non-vertical structure, is attached on the semiconductor chip 130A or 130B of the first substrate 110 or the second substrate 120, and the other end thereof is attached to the pattern 111 or 121 of the first substrate 111 or the second substrate 120 by using the adhesive 112 or 123. A metal bridge 170 formed in a vertical structure between the first substrate 110 and the second substrate 120 is used to respectively support the first substrate 110 and the second substrate 120.

More specifically, as illustrated in an enlarged view of FIGS. 10, 11A and 11B, the metal post 140 in a clip form includes the first horizontal clip 144 and the second horizontal clip 145, wherein the first horizontal clip 144 is each attached on and electrically connected to the semiconductor chip 130A or 130B of the first substrate 110 or the second substrate 120, and the second horizontal clip 145 is bent and extended from one end of the first horizontal clip 144 in a horizontal direction and is each attached on and electrically connected to the pattern 111 or 121 of the first substrate 110 or the second substrate 120, on which the first horizontal clip 144 is also attached, by using adhesives. Accordingly, a CTE stress, which may be directly delivered from the second substrate 120, the adhesive 123, or the metal post 140 to the semiconductor chip 130A, or a CTE stress, which may be directly delivered from the first substrate 110, the adhesive 112, or the metal post 140 to the semiconductor chip 130B, may be detoured and dispersed. Therefore, cracks generated in parts bonded to the semiconductor chips 130A and 130B, which are the adhesive 112 and the adhesive 123, may be prevented.

In addition, a space between the first substrate 110 and the second substrate 120 may be maintained through the metal bridge 170 bonded to the patterns 111 and 121 of the first substrate 110 and the second substrate 120 by using an adhesive 171 and thereby, a structural change may be prevented.

Figure 12:
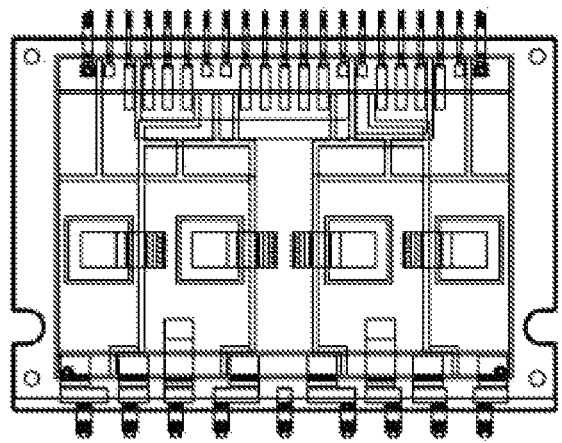
FIGS. 12, 13A and 13B illustrate a third example of a semiconductor package according to another embodiment of the present invention.
Figure 12:
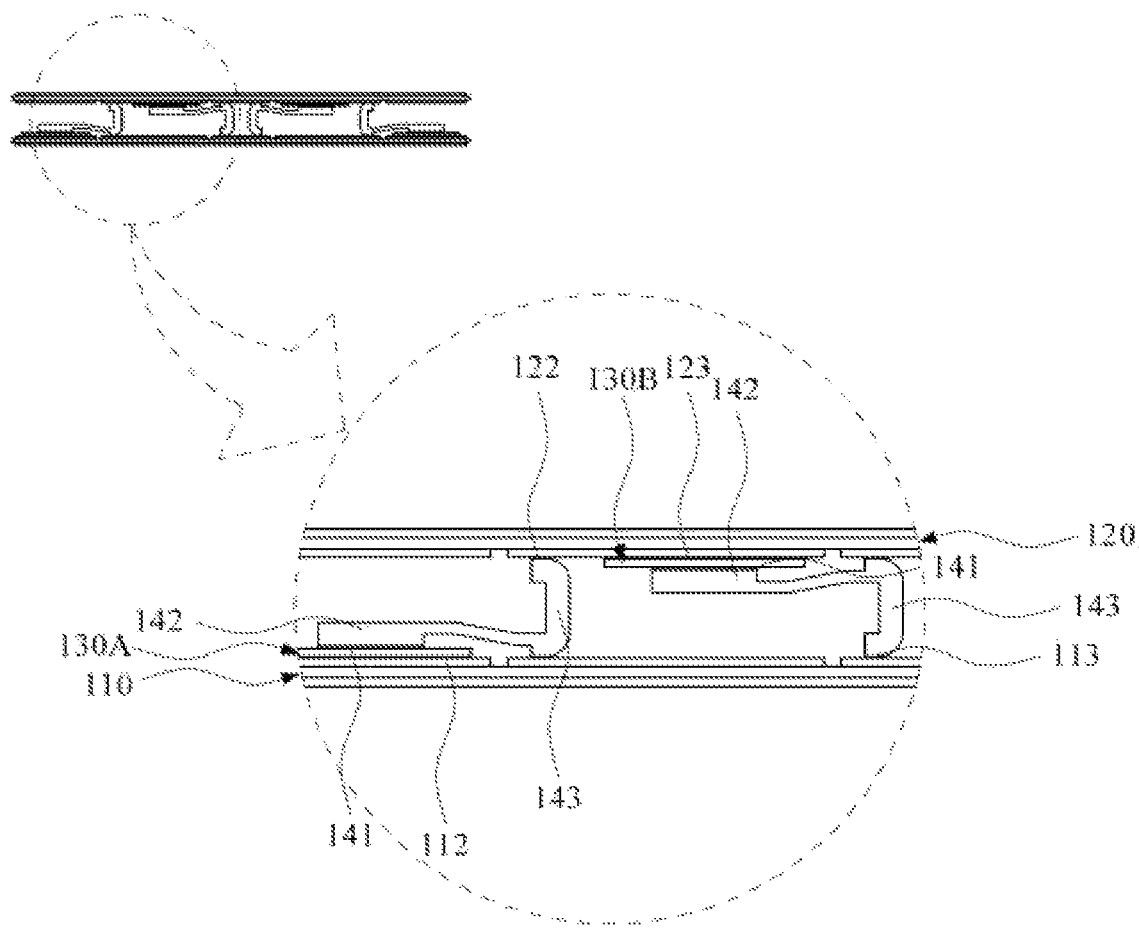
Figure 13A:
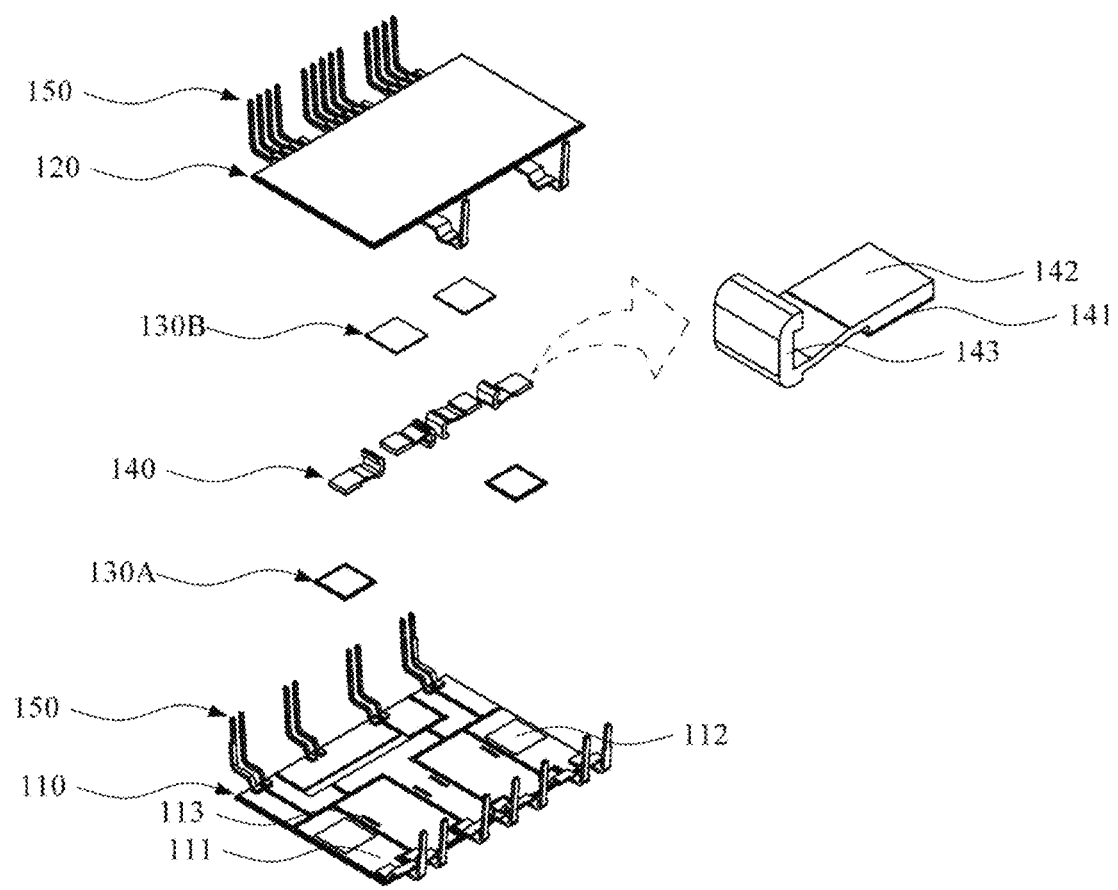
Figure 13B:
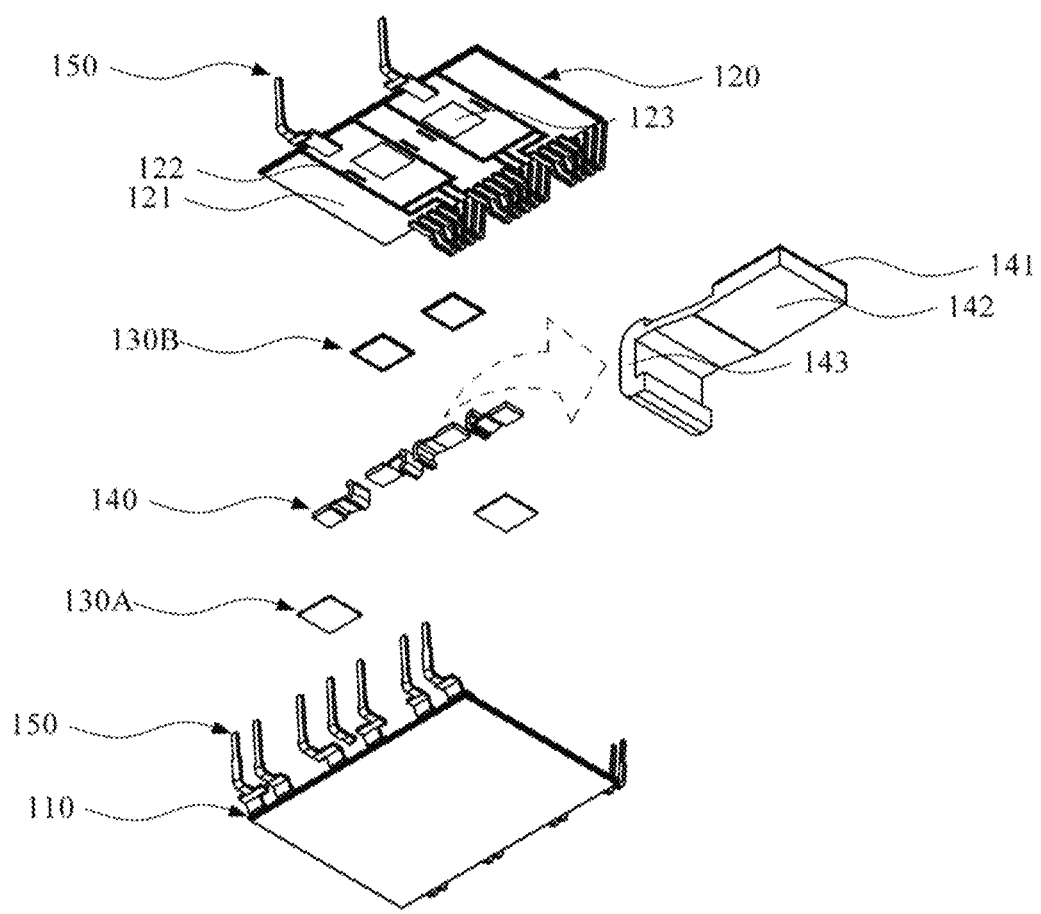

FIGS. 12, 13A and 13B illustrate a third example of a semiconductor package according to another embodiment of the present invention. The semiconductor chips 130A are electrically connected to the first substrate 110, the semiconductor chips 130B are electrically connected to the second substrate 120, and the terminal leads 150, which are lead frames, are each connected to the first substrate 110 and the second substrate 120. Also, one end of the metal post 140, which has a non-vertical structure, is attached on the semiconductor chip 130A of the first substrate 110, and the other end thereof is attached on the pattern 121 of the second substrate 120 by using the adhesive 122. Symmetrically, one end of the metal post 140, which has a non-vertical structure, is attached on the semiconductor chip 130B of the second substrate 120, and the other end thereof is attached on the pattern 111 of the first substrate 120 by using the adhesive 113.

More specifically, as illustrated in an enlarged view of FIGS. 12, 13A and 13B, the metal post 140 includes the horizontal clip 142 and the vertical clip 143, wherein the horizontal clip 142 is attached on and electrically connected to the semiconductor chip 130A of the first substrate 110, and the vertical clip 143 is extended from one end of the horizontal clip 142 in a vertical direction and is each attached on and electrically connected to the patterns 111 and 121 of the first substrate 110 and the second substrate 120. Accordingly, the metal post 140 has a non-vertical structure in a L-letter clip form so that a CTE stress, which may be delivered from the second substrate 120, the adhesive 122, or the metal post 140 to the semiconductor chip 130A, may be detoured and dispersed to the pattern 111 of the first substrate 110 through the vertical clip 143. Symmetrically, the metal post 140 includes the horizontal clip 142 and the vertical clip 143, wherein the horizontal clip 142 is attached on and electrically connected to the semiconductor chip 130B of the second substrate 120, and the vertical clip 143 is extended from one end of the horizontal clip 142 in a vertical direction and is each attached on and electrically connected to the patterns 121 and 111 of the second substrate 120 and the first substrate 110. Accordingly, the metal post 140 has a non-vertical structure in a ¬-letter clip form so that a CTE stress, which may be delivered from the first substrate 110, the adhesive 113, or the metal post 140 to the semiconductor chip 130B, may be detoured and dispersed to the pattern 111 of the first substrate 110 through the vertical clip 143. Therefore, cracks generated in parts bonded to the semiconductor chips 130A and 130B, which are the adhesives 112, 123, and 141 may be prevented.

Figure 14:
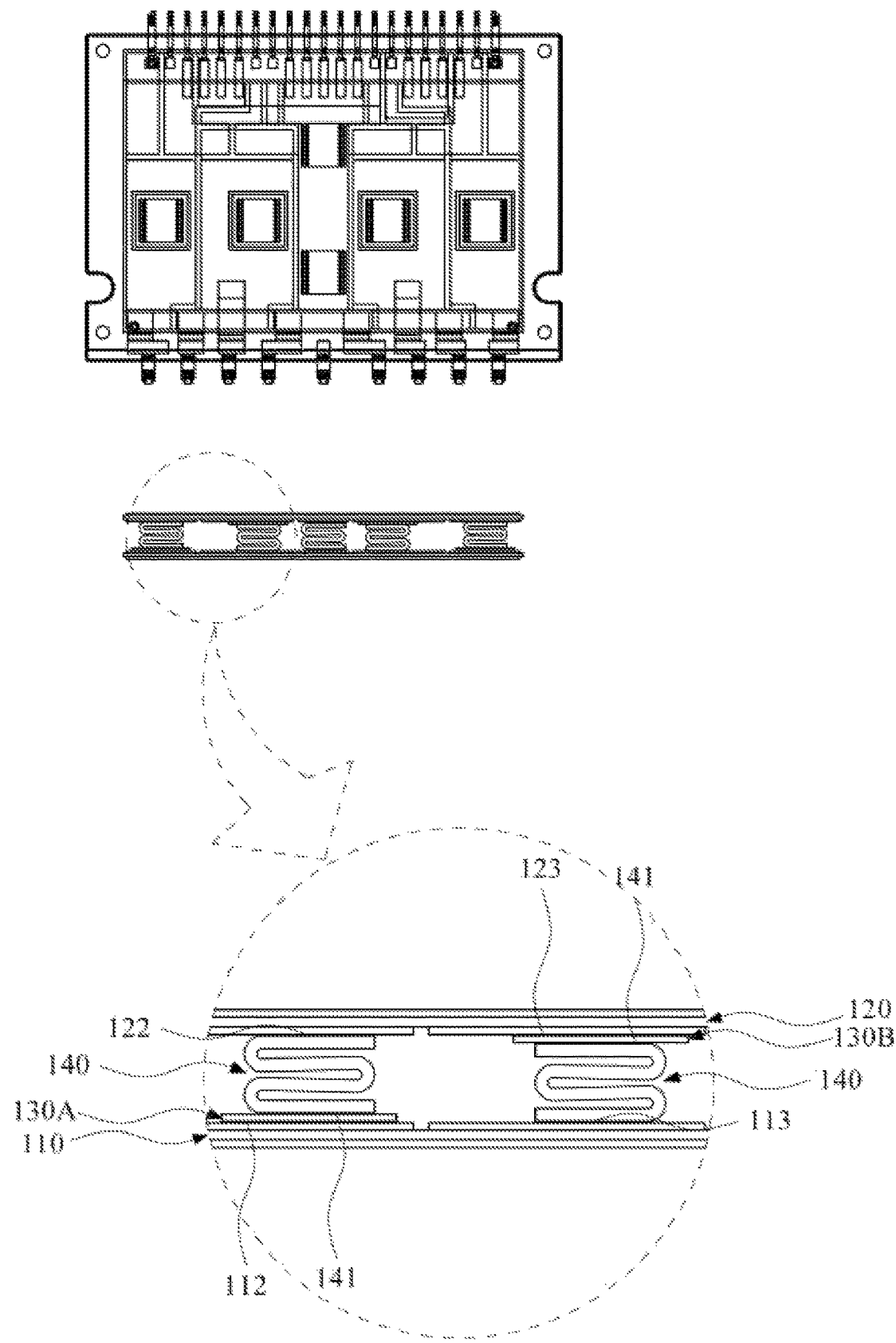
FIGS. 14, 15A and 15B illustrate a fourth example of a semiconductor package according to another embodiment of the present invention.
Figure 15A:
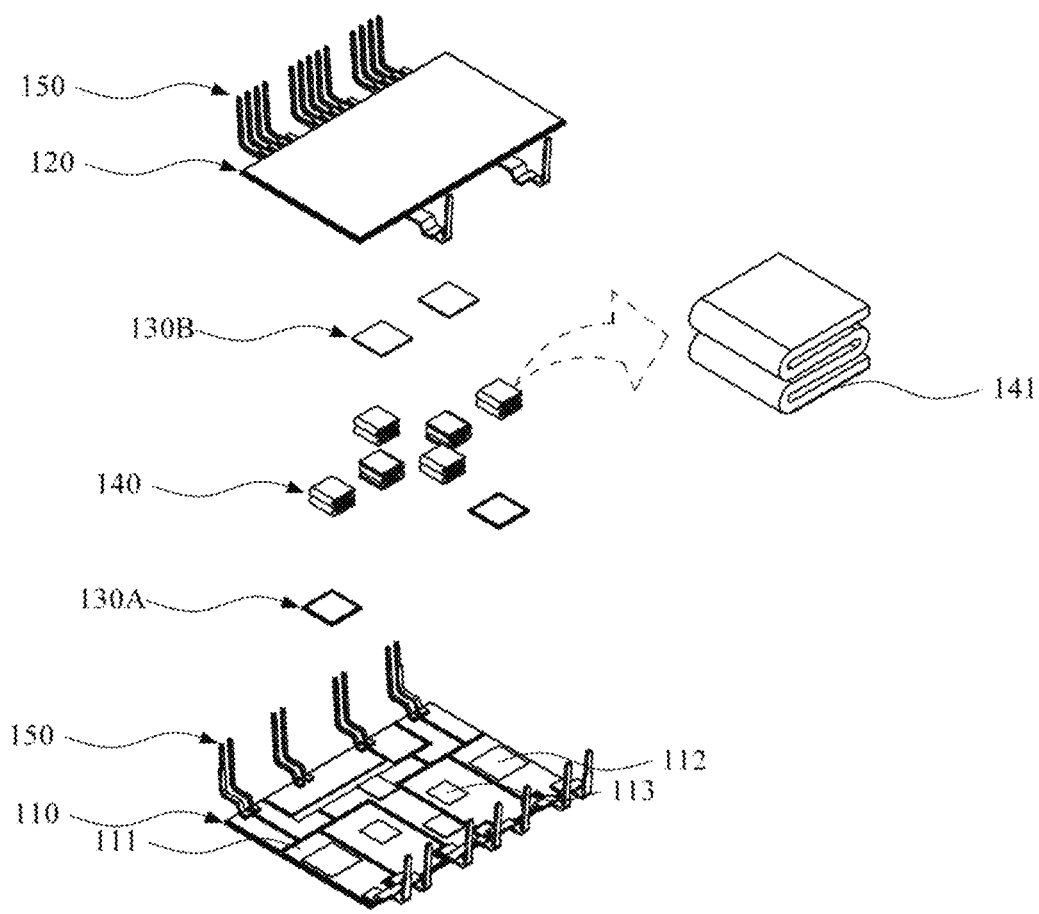
Figure 15B:
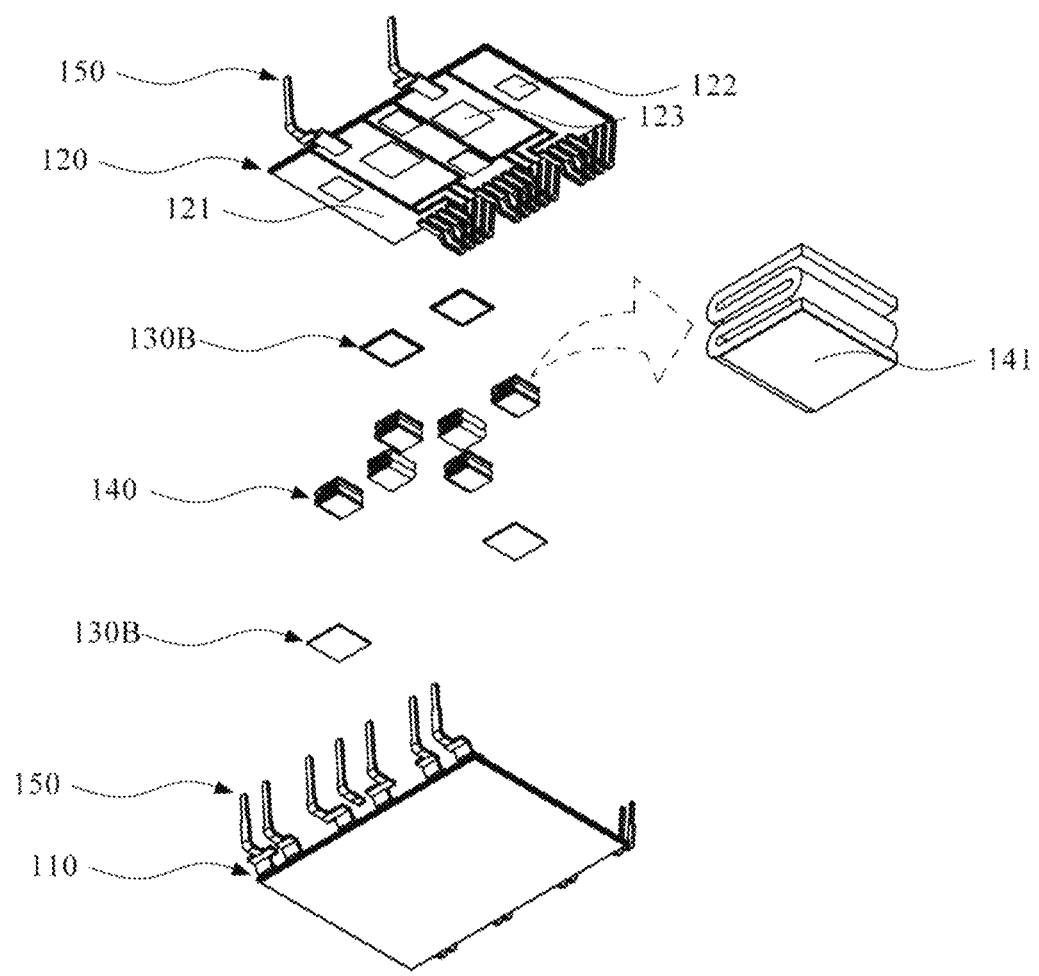

FIGS. 14, 15A and 15B illustrate a fourth example of a semiconductor package according to another embodiment of the present invention. As illustrated in FIGS. 14, 15A and 15B, the semiconductor chips 130A of the first substrate 110 or the semiconductor chips 130B of the second substrate 120 are selectively and electrically connected, the terminal leads 150, which are lead frames, are connected to the first substrate 110 and the second substrate 120, and the first and second substrates 110 and 120 are supported by using the metal posts 140 as the replacement of general metal spacers. Also, one end of the metal post 140, which has a non-vertical structure, is attached on the semiconductor chip 130A of the first substrate 110 and the other end thereof is attached to the pattern 121 of the second substrate 120 by using the adhesive 122. Symmetrically, one end of the metal post 140 is attached on the semiconductor chip 130B of the second substrate 120 and the other end thereof is attached to the pattern 111 of the first substrate 110 by using the adhesive 113.

More specifically, as illustrated in an enlarged view of FIGS. 14, 15A and 15B, the metal post 140 has a non-vertical structure in an E-letter zigzag form between the first substrate 110 and the second substrate 120 so that a CTE stress, which may be delivered from the adhesive 122 or the metal post 140 to the semiconductor chip 130A, or a CTE stress, which may be delivered from the adhesive 113 or the metal post 140 to the semiconductor chip 130A, may be absorbed and relieved by using the elastic non-vertical structure in a zigzag form which performs as a spring. Accordingly, cracks generated in parts bonded to the semiconductor chips 130A and 130B, which are the adhesives 112, 123, and 141 may be prevented.

The first substrate 110 or the second substrate 120 of the semiconductor packages according to the above embodiments may include one or more insulation layer.

Also, the first substrate 110 or the second substrate 120 may be formed of a single metal layer, an alloy metal layer, or a plated metal layer.

In addition, referring to FIG. 2 as a representative drawing, the first substrate 110 or the second substrate 120 may be formed by stacking an insulation layer I and metal layers M formed on the upper surface, the lower surface, or the upper and lower surfaces of the insulation layer I.

The semiconductor chip 130 may include any one of IGBT, MOSFET, and a diode, which is a power semiconductor.

The metal post 140 of the semiconductor packages according to the above embodiments may be formed of a single material including Cu, Al, or Sn, an alloy material containing any one of Cu, Al, Sn, SiC, Mo, and Mn, or a compound material including a powder mixture.

Although not illustrated, the metal post 140 may include at least one layer formed by metal plating or metal coating.

The terminal lead 150 may be bonded to the first substrate 110 or the second substrate 120 by soldering, sintering, or ultrasonic welding.

Also, the metal post 140 of the semiconductor packages according to the above embodiments may be each bonded to the pattern 111 or 121 of the first substrate 110 or the second substrate 120 by ultrasonic welding.

Figure 16A:
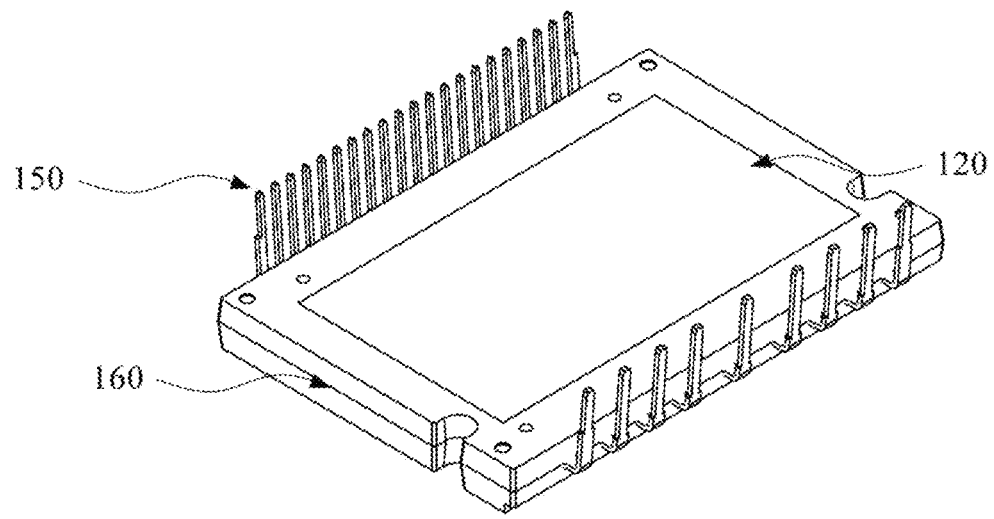
FIGS. 16A and 16B illustrate a whole structure of a semiconductor package according to the embodiments of the present invention.
Figure 16B:
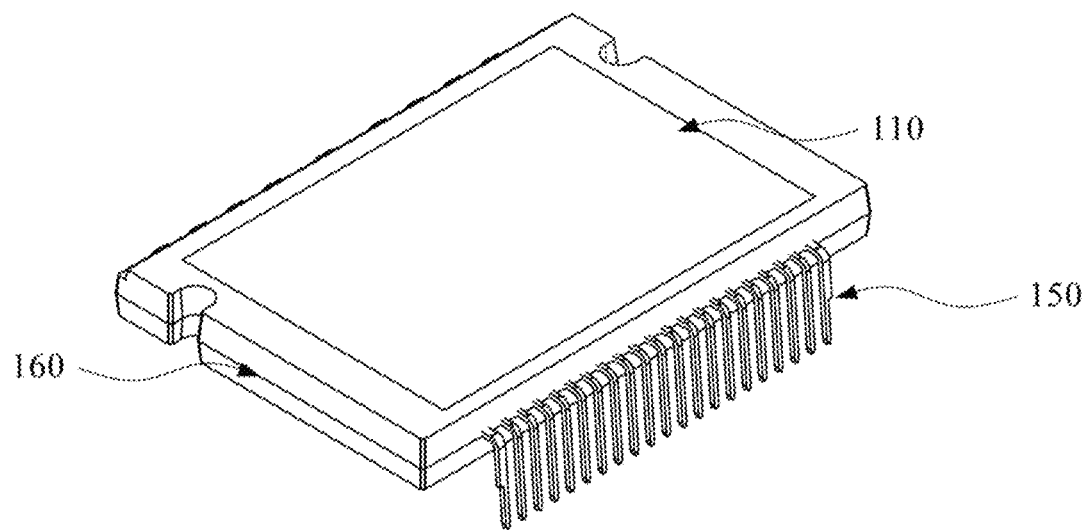

As illustrated in FIGS. 16A and 16B, the entire or parts of the first substrate 110 or the second substrate 120 are formed to be exposed to the upper surface or the outer lower surface of the package housing 160. The surfaces of the first substrate 110 or the second substrate 120 exposed to the outside of the package housing 160 may include a lattice for widening radiating surfaces, a radiation fin, or a radiation structure in a water-cooling type or an air-cooling type. Accordingly, heat generated while operating the semiconductor package may be effectively radiated so that durability may be improved, and stability may be secured.

Here, the package housing 160 may be formed of EMC, PBT, or PPS for insulation and protect an internal circuit.

Also, electrical signal lines (not illustrated) for applying an electrical signal to the semiconductor chips 130 may be bonded to the first substrate 110, the second substrate 120, the terminal lead 150, or the semiconductor chip 130 and may be electrically connected to each other, wherein the electrical signal lines may be conductive wires, metal clips, metal ribbons, or metal bridges.

To sum up, the metal post 140 as described above has a non-vertical structure in an E-letter, S-letter or a Z-letter zigzag form or in a ¬-letter, a L-letter, or —-letter form. Accordingly, a CTE stress which may be directly delivered to the semiconductor chips may be relieved by using a spring structure or detoured to be dispersed.

In addition, the semiconductor packages according to the above embodiments may have structures used in an inverter, a converter, or driving of a motor.

Another embodiment of the present invention may provide a method of manufacturing a semiconductor package including sequentially forming the first substrate, the second substrate, the semiconductor chips, the metal posts, the terminal leads, and the package housing described in the semiconductor package according to the above embodiments.

Therefore, according to the semiconductor packages and the method of manufacturing the semiconductor package described above, as the replacement of a high-priced metal spacer formed using a material similar with a CTE of the semiconductor chip, the metal post having a non-vertical structure and high price competitiveness may be used to absorb, relieve, detour, and disperse a CTE stress and thereby, cracks generated in the adhesives, which are parts bonded to the semiconductor chips, may be prevented.

According to the present invention, as the replacement of a high-priced metal spacer formed using a material similar with a CTE of the semiconductor chip, the metal post having a non-vertical structure and high price competitiveness may be used to absorb, relieve, detour, and disperse a CTE stress and thereby, cracks generated in the adhesives, which are parts bonded to the semiconductor chips, may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
a first substrate comprising a first pattern formed thereon to enable electrical connection;
a second substrate, which is spaced apart from and faces the first substrate, comprising a second pattern formed thereon to enable electrical connection;
at least one semiconductor chip attached to the first substrate;
at least one metal post formed in a non-vertical structure between the first substrate and the second substrate for dispersing a coefficient of thermal expansion (CTE) stress directly generated from the second substrate, wherein the at least one metal post comprises:
a vertical clip having an upper end attached to the second pattern of the second substrate and a lower end attached to the first pattern of the first substrate; and
a horizontal clip having a first end attached to the at least one semiconductor chip and a second end attached to the lower end of the vertical clip;
at least one terminal lead electrically connected to any one of the first substrate and the second substrate; and
a package housing covering the first substrate and the second substrate and exposing the at least one terminal lead to an outside,
wherein the at least one metal post has an L-shape such that a height of an upper surface of the first end of the horizontal clip from the first substrate is less than a height of an upper surface of the upper end of the vertical clip from the first substrate,
wherein the upper surface of the first end of the horizontal clip is not in contact with the second substrate.

2. The semiconductor package of claim 1, wherein the first substrate or the second substrate comprises at least one insulation layer, or is formed of a single metal layer, or is formed of an alloy metal layer, or is formed of a plated metal layer, or is formed by stacking metal layers on an upper surface, a lower surface, or the upper and lower surfaces of the at least one insulation layer.

3. The semiconductor package of claim 1, further comprising a metal bridge formed in a vertical structure between the first substrate and the second substrate to support and electrically connect the first substrate and the second substrate.

4. The semiconductor package of claim 1, wherein the at least one metal post is attached to the first pattern of the first substrate or the second pattern of the second substrate by ultrasonic welding.

5. The semiconductor package of claim 1, wherein the first substrate or the second substrate is formed to be entirely or partly exposed to an upper surface or an outer lower surface of the package housing.

6. A semiconductor package comprising:
a first substrate comprising a first pattern formed thereon to enable electrical connection;
a second substrate, which is spaced apart from and faces the first substrate, comprising a second pattern formed thereon to enable electrical connection;
at least one first semiconductor chip attached to the first substrate;
at least one second semiconductor chip attached to the second substrate;

at least one first metal post formed in a non-vertical structure between the first substrate and the second substrate for dispersing a coefficient of thermal expansion (CTE) stress directly generated from the first substrate and the second substrate, wherein the at least one first metal post comprises:
   a first vertical clip having a first upper end attached to the second pattern of the second substrate and a first lower end attached to the first pattern of the first substrate; and
   a first horizontal clip having a first end attached to the at least one first semiconductor chip and a second end attached to the first lower end of the first vertical clip;
at least one second metal post formed between the first substrate and the second substrate, wherein the at least one second metal post comprises:
   a second vertical clip having a second upper end attached to the second pattern of the second substrate and a second lower end attached to the first pattern of the first substrate; and
   a second horizontal clip having a third end attached to at least one second semiconductor chip and a fourth end attached to the second upper end of the second vertical clip;
at least one terminal lead electrically connected to any one of the first substrate and the second substrate; and
a package housing covering the first substrate and the second substrate and exposing the at least one terminal lead to an outside.

7. The semiconductor package of claim 6, wherein the first substrate or the second substrate comprises at least one insulation layer, or is formed of a single metal layer, or is formed of an alloy metal layer, or is formed of a plated metal layer, or is formed by stacking metal layers on upper surface, a lower surface, or the upper and lower surfaces of the at least one insulation layer.

8. The semiconductor package of claim 6, further comprising a metal bridge formed in a vertical structure between the first substrate and the second substrate to support and electrically connect the first substrate and the second substrate.

9. The semiconductor package of claim 6, wherein the at least one first metal post is attached to the first pattern of the first substrate or the second pattern of the second substrate by ultrasonic welding, and the at least one second metal post is attached to the first pattern of the first substrate or the second pattern of the second substrate by ultrasonic welding.

10. The semiconductor package of claim 6, wherein the first substrate or the second substrate is formed to be entirely or partly exposed to an upper surface or an outer lower surface of the package housing.

11. A semiconductor package comprising:
a first substrate comprising a first pattern formed thereon to enable electrical connection;
a second substrate, which is spaced apart from and faces the first substrate, comprising a second pattern formed thereon to enable electrical connection;
at least one semiconductor chip attached to the first substrate;
at least one metal post formed between the first substrate and the second substrate, wherein the at least one metal post comprises:
   a first horizontal clip having a first end attached to the at least one semiconductor chip and a second end; and
   a second horizontal clip having a third end attached to the second end of the first horizontal clip and a fourth end attached to the first pattern of the first substrate, wherein no portion of the first and second horizontal clips is connected to the second substrate;
at least one terminal lead electrically connected to any one of the first substrate and the second substrate; and
a package housing covering the first substrate and the second substrate and exposing the at least one terminal lead to an outside.

12. A semiconductor package comprising:
a first substrate comprising a first pattern formed thereon to enable electrical connection;
a second substrate, which is spaced apart from and faces the first substrate, comprising a second pattern formed thereon to enable electrical connection;
at least one first semiconductor chip attached to the first substrate;
at least one second semiconductor chip attached to the second substrate;
at least one first metal post formed between the first substrate and the second substrate, wherein the at least one first metal post comprises:
   a first horizontal clip having a first end attached to the at least one first semiconductor chip and a second end; and
   a second horizontal clip having a third end attached to the second end of the first clip and a fourth end attached to the first pattern of the first substrate, wherein no portion of the first and second horizontal clips is connected to the second substrate and the at least one second semiconductor chip;
at least one second metal post formed between the first substrate and the second substrate, wherein the at least one second metal post comprises:
   a third horizontal clip having a fifth end attached to the at least one second semiconductor chip and a sixth end; and
   a fourth horizontal clip having a seventh end attached to the sixth end of the third horizontal clip and an eighth end attached to the second pattern of the second substrate, wherein no portion of the third and fourth horizontal clips is connected to the first substrate and the at least one first semiconductor chip;
at least one terminal lead electrically connected to any one of the first substrate and the second substrate; and
a package housing covering the first substrate and the second substrate and exposing the at least one terminal lead to an outside.

* * * * *